(12) United States Patent
Wang et al.

(10) Patent No.: US 12,707,619 B2
(45) Date of Patent: Aug. 11, 2026

(54) STATIC RANDOM ACCESS MEMORY WITH PRE-CHARGE CIRCUIT

(71) Applicant: Taiwan Semiconductor Manufacturing Company, Ltd., Hsinchu (TW)

(72) Inventors: Po-Sheng Wang, Hsinchu (TW); Yangsyu Lin, New Taipei City (TW); Cheng Hung Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 646 days.

(21) Appl. No.: 17/125,688

(22) Filed: Dec. 17, 2020

(65) Prior Publication Data

US 2022/0085035 A1 Mar. 17, 2022

Related U.S. Application Data

(60) Provisional application No. 63/078,040, filed on Sep. 14, 2020.

(51) Int. Cl.

*H10B 10/00* (2023.01)
*G11C 11/412* (2006.01)
*G11C 11/419* (2006.01)

(52) U.S. Cl.

CPC ............ *H10B 10/12* (2023.02); *G11C 11/412* (2013.01); *G11C 11/419* (2013.01); *H10B 10/18* (2023.02)

(58) Field of Classification Search

CPC ....... G11C 7/12; G11C 11/419; G11C 11/412; G11C 11/413; G11C 8/08; H01L 27/1116; H01L 27/1104; H10B 10/12; H10B 10/18

USPC ........................................................ 257/368

See application file for complete search history.

(56) References Cited

U.S. PATENT DOCUMENTS 6,041,428 A * 3/2000 Pelagalli ............... G11C 11/412 714/734
7,463,057 B1 * 12/2008 Rahim .............. H03K 19/1776 326/38
8,811,070 B1 * 8/2014 Rai ...................... G11C 11/413 365/194
9,779,802 B1 * 10/2017 Chang ................. G11C 7/1096
9,997,217 B1 6/2018 Goel et al.

(Continued)

FOREIGN PATENT DOCUMENTS

CN 102592662 A * 7/2012
DE 102018108671 A1 12/2018

*Primary Examiner* — Teresa M. Arroyo

(74) *Attorney, Agent, or Firm* — Sterne, Kessler, Goldstein & Fox P.L.L.C.

(57) ABSTRACT

The present disclosure describes embodiments of a memory device with a pre-charge circuit. The memory device can include a memory cell, and the pre-charge circuit can include a first transistor and a second transistor. The first transistor includes a first gate terminal, a first source/drain (S/D) terminal coupled to a reference voltage, and a second S/D terminal coupled to a first terminal of the memory cell. The second transistor includes a second gate terminal, a third S/D terminal coupled to the reference voltage, and a fourth S/D terminal coupled to the second terminal of the memory cell. The first and second transistors are configured to pass the reference voltage in response to the control signal being applied to the first and second gate terminals, respectively.

20 Claims, 18 Drawing Sheets

(56) References Cited

U.S. PATENT DOCUMENTS 10,553,275 B2 2/2020 Lin et al.
10,755,770 B2 * 8/2020 Aggarwal ............. G11C 11/413
2001/0040817 A1 11/2001 Azuma
2004/0081009 A1 * 4/2004 Mangyo .............. G11C 11/4097 365/203
2005/0122821 A1 * 6/2005 Redwine ............... G11C 11/417 365/229
2005/0152199 A1 * 7/2005 Park ..................... G11C 15/043 365/222
2006/0171215 A1 * 8/2006 Dawson ................... G11C 7/12 365/194
2010/0296329 A1 * 11/2010 Summerfelt ............ G11C 11/22 365/201
2012/0014172 A1 1/2012 Jung et al.
2012/0106236 A1 5/2012 Singh et al.
2012/0243356 A1 9/2012 Sasaki et al.
2013/0308397 A1 * 11/2013 Kohli .................... G11C 11/419 365/230.06
2015/0063007 A1 3/2015 Choi et al.
2015/0348598 A1 * 12/2015 Wang .................... G11C 11/417 365/72
2016/0211007 A1 7/2016 Kohara
2017/0053695 A1 * 2/2017 Sonkar .................. G11C 11/413
2018/0294018 A1 10/2018 Baeck et al.
2018/0308544 A1 10/2018 Cadigan et al.
2019/0066807 A1 2/2019 Bonitz
2019/0103156 A1 4/2019 Sumbul et al.
2019/0341107 A1 11/2019 Bertin
2020/0105321 A1 4/2020 Sinangil et al.

* cited by examiner

STATIC RANDOM ACCESS MEMORY WITH PRE-CHARGE CIRCUIT

CROSS-REFERENCE TO RELATED APPLICATION

This application claims the benefit of U.S. Provisional Patent Application No. 63/078,040, titled "Static Random Access Memory with Pre-Charge Circuit," which was filed on Sep. 14, 2020 and is incorporated herein by reference in its entirety.

BACKGROUND

Static random access memory (SRAM) is a type of semiconductor memory used in computing applications that require, for example, high-speed data access. For example, cache memory applications use SRAM to store frequently-accessed data e.g., data accessed by a central processing unit.

The SRAM's cell structure and architecture enable high-speed data access. The SRAM cell can include a bi-stable flip-flop structure with, for example, four to ten transistors. An SRAM architecture can include one or more arrays of memory cells and support circuitry. Each of the SRAM arrays is arranged in rows and columns called "wordlines" and "bitlines," respectively. The support circuitry includes address and driver circuits to access each of the SRAM cells—via the wordlines and bitlines—for various SRAM operations.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

DETAILED DESCRIPTION

Figure 1:
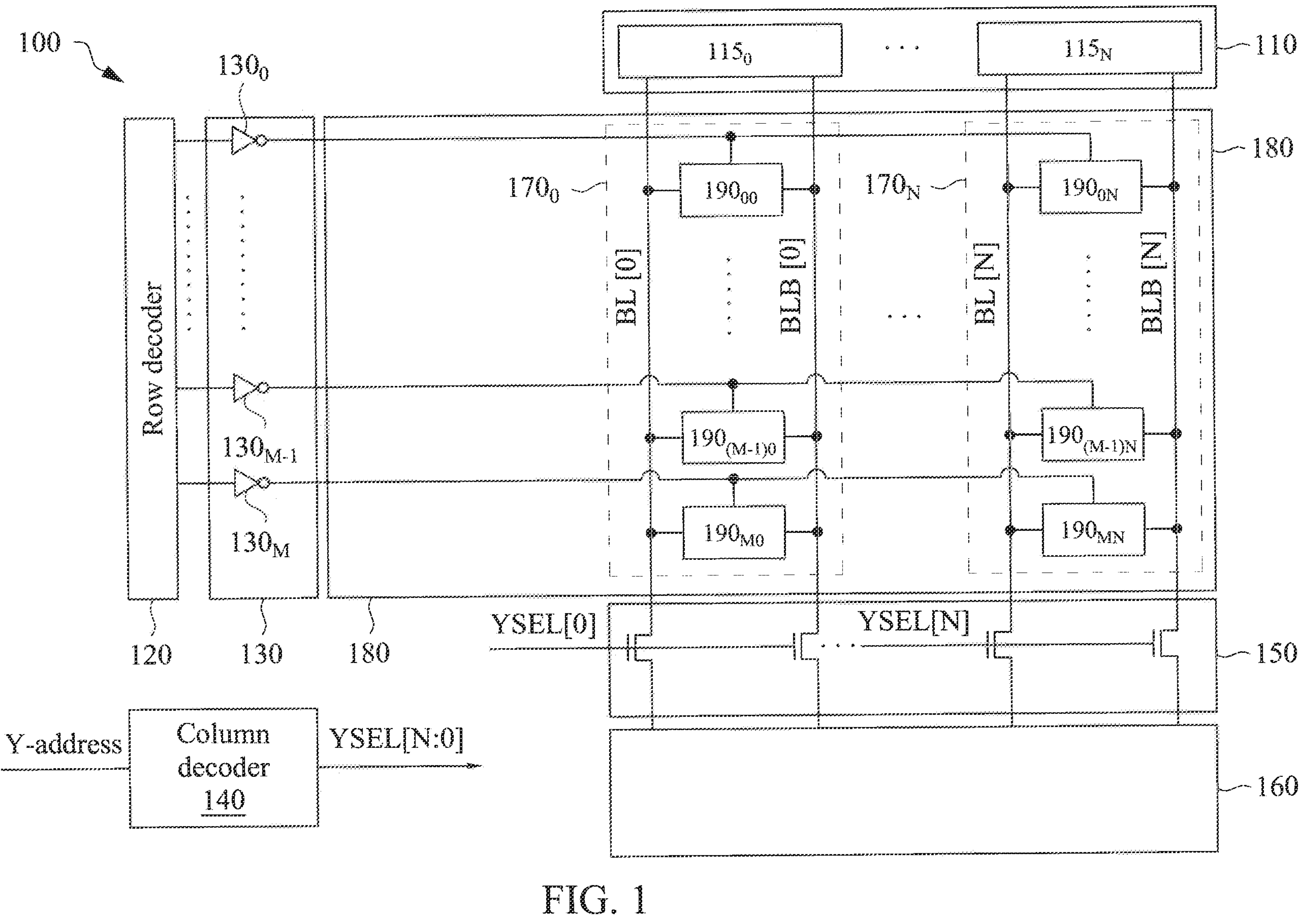
FIG. 1 is an illustration of a static random access memory with a pre-charge circuit, according to some embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

The following disclosure describes aspects of a static random access memory (SRAM). Specifically, the disclosure describes different embodiments related to an SRAM pre-charge circuit. For ease of explanation, certain SRAM circuit elements and control circuits are disclosed to facilitate in the description of the different embodiments. The SRAM can also include other circuit elements and control circuits. These other circuit elements and control circuits are within the spirit and scope of this disclosure.

FIG. 1 is an illustration of a static random access memory (SRAM) device 100 with a pre-charge circuit 110, according to some embodiments of the present disclosure. SRAM device 100 also includes a row decoder 120, a wordline driver 130, a column decoder 140, a column multiplexer (MUX) 150, a read/write circuit 160, and an SRAM array 180. SRAM array 180 includes columns of SRAM cells $170_0$-$170_N$.

Each of the SRAM cells in SRAM array 180 is accessed—e.g., for memory read and memory write operations—using a memory address. Based on the memory address, row decoder 120 selects a row of memory cells to access via wordline driver 130. Also, based on the memory address, column decoder 140 selects a column of memory cells $170_0$-$170_N$ to access via column MUX 150. For a memory read operation, read write circuit 160 senses a voltage level on bitline pairs BL/BLB. For a memory write operation, read/write circuit 160 generates voltages for bitline pairs BL/BLB in columns of memory cells $170_0$-$170_N$. The notation "BL" refers to a bitline, and the notation "BLB" refers to the complement of BL. The intersection of the accessed row and the accessed column of memory cells results in access to a single memory cell 190.

Each of columns of memory cells 170$_0$-170$_N$ includes memory cells 190. Memory cells 190 can be arranged in one or more arrays in SRAM device 100. In the present disclosure, a single SRAM array 180 is shown to simplify the description of the disclosed embodiments. SRAM array 180 has "M" number of rows and "N" number of columns. The notation "190$_{00}$" refers to memory cell 190 located in row '0', column 170$_0$. Similarly, the notation "190$_{MN}$" refers to memory cell 190 located in row 'M', column 170$_N$.

Figure 2:
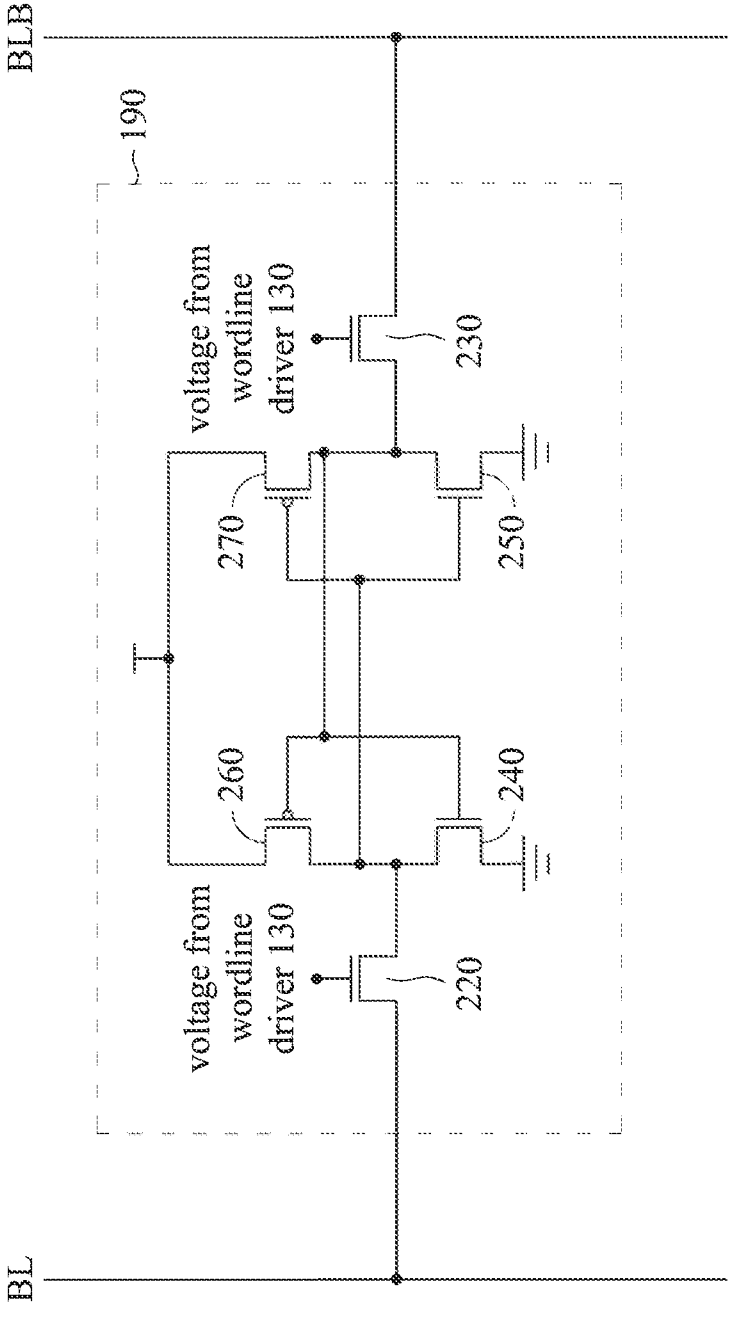
FIG. 2 is an illustration of an example static random access memory circuit topology.

In some embodiments, memory cell 190 can have a six transistor ("6T") circuit topology. FIG. 2 is an illustration of an example 6T circuit topology for memory cell 190. The 6T circuit topology includes n-type field effect transistor (NFET) pass devices 220 and 230, NFET pull-down devices 240 and 250, and p-type FET (PFET) pull-up devices 260 and 270. The FET devices (e.g., NFET devices and PFET devices) can be planar metal-oxide-semiconductor FETs, finFETs, gate-all-around FETs, any suitable FETs, or combinations thereof. Other memory cell topologies, such as four transistor ("4T"), eight transistor ("8T"), and ten transistor ("10T") circuit topologies, are within the spirit and scope of the present disclosure.

A voltage from wordline driver 130 controls NFET devices 220 and 230 to pass voltages from the bitline pair BL/BLB to a bi-stable flip-flop structure formed by NFET devices 240 and 250 and PFET devices 260 and 270. The bitline pair BL/BLB voltages can be used during a memory read operation and a memory write operation. During the memory read operation, the voltage applied by wordline driver 130 to the gate terminals of NFET pass devices 220 and 230 can be at a sufficient voltage level to pass a voltage stored in the bi-stable flip-flop structure to the BL and BLB, which can be sensed by read/write circuit 160. For example, if a '1' or a logic high value (e.g., a power supply voltage, such as 0.4 V, 0.6 V, 0.7 V, 1.0 V, 1.2 V, 1.8 V, 2.4 V, 3.3 V, 5 V, and any other suitable voltage) is passed to the BL and a '0' or a logic low value (e.g., ground or 0 V) is passed to the BLB, read/write circuit 160 can sense (or read) these values. During the memory write operation, if the BL is at a '1' or a logic high value and the BLB is at a '0' or a logic low value, the voltage applied by wordline driver 130 to the gate terminals of NFET pass devices 220 and 230 can be at a sufficient voltage level to pass the BL's logic high value and the BLB's logic low value to the bi-stable flip-flop structure. As a result, these logic values are written (or programmed) into the bi-stable flip-flop structure.

In some embodiments, as illustrated in FIG. 1, pre-charge circuit 110 is proximately located near an upper portion of SRAM array 180. The proximate location of pre-charge circuit 110 can be in other locations of SRAM device 100, such as near a lower portion of SRAM array 180. In some embodiments, pre-charge circuit 110 includes multiple pre-charge cells 115$_0$-115$_N$ that connect to columns of memory cells 170$_0$-170$_N$, respectively. Pre-charge cells 115$_0$-115$_N$ charge the bitline pair BL/BLB for each memory cell 190 in columns of memory cells 117$_0$-170$_N$ to a reference voltage, such as a power supply voltage (e.g., 0.4 V, 0.6 V, 0.7 V, 1.0 V, 1.2 V, 1.8 V, 2.4 V, 3.3 V, 5 V, and any other suitable voltage), prior to a memory read operation and/or a memory write operation.

Figure 3:
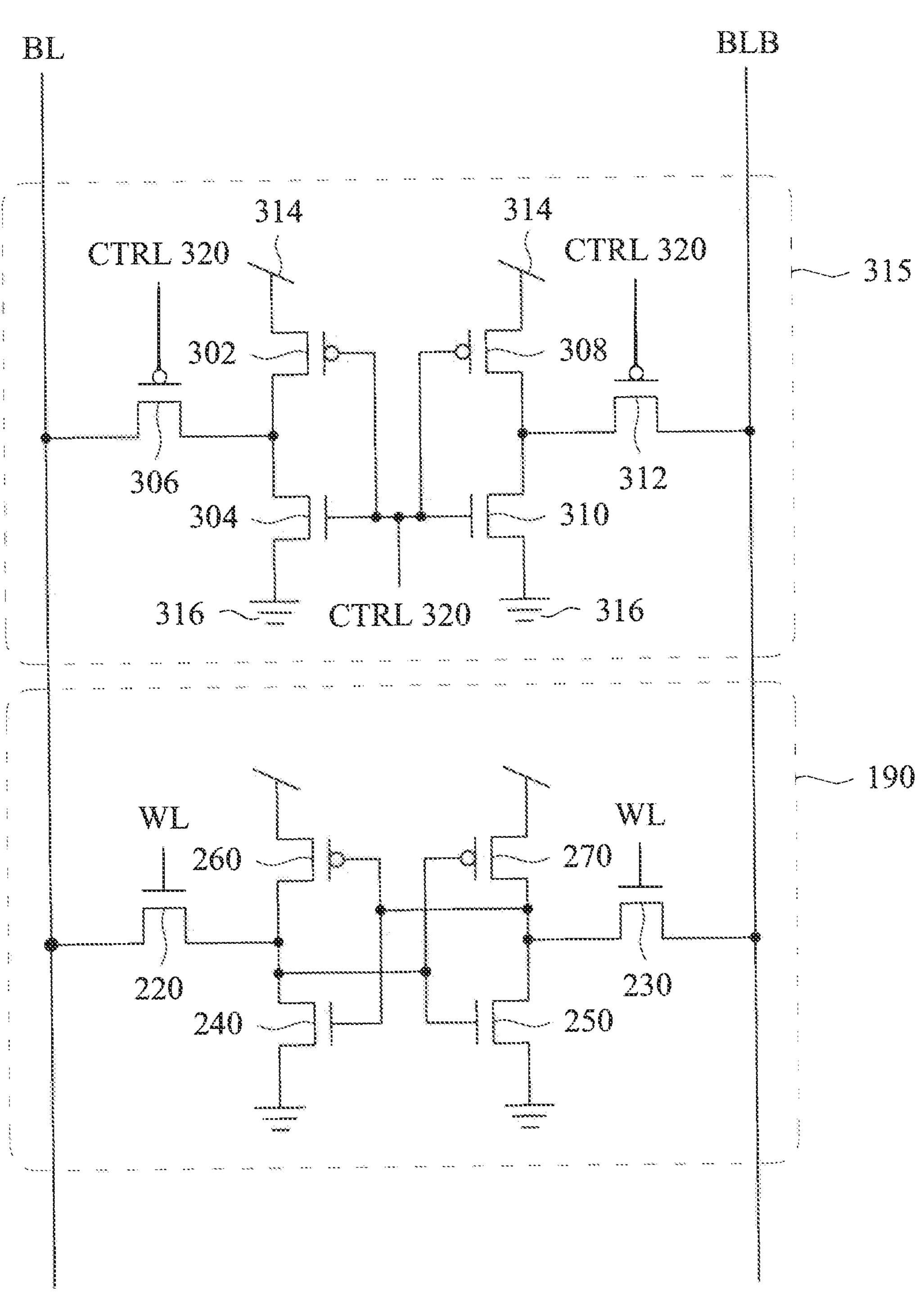
FIG. 3 is an illustration of a first pre-charge cell topology, according to some embodiments of the present disclosure.

FIG. 3 is an illustration of a pre-charge cell 315, according to some embodiments. In some embodiments, pre-charge cells 115$_0$-115$_N$ of FIG. 1 can each have the same circuit topology as pre-charge cell 315. For simplicity and illustration purposes, FIG. 3 shows one pre-charge cell 315 coupled to one memory cell 190. Based on the description herein, pre-charge cell 315 can be coupled to more than one memory cell 190, such as memory cells 190$_{00}$-190$_{M0}$ in column '0' of SRAM array 180. The other elements of SRAM device 100 are not shown in FIG. 3 for simplicity.

Pre-charge cell 315 charges the bitline pair BL/BLB of one or more memory cells to a first reference voltage 314, such as a power supply voltage (e.g., 0.4 V, 0.6 V, 0.7 V, 1.0 V, 1.2 V, 1.8 V, 2.4 V, 3.3 V, 5 V, and any other suitable voltage), prior to a memory read operation and/or a memory write operation according to some embodiments. In some embodiments, pre-charge cell 315 includes a PFET device 302, an NFET device 304, a PFET pass device 306, a PFET device 308, an NFET device 310, and a PFET pass device 312. The PET devices (e.g., NFET devices and PFET devices) can be planar metal-oxide-semiconductor FETs, finFETs, gate-all-around FETs, any suitable FETs, or combinations thereof.

PFET device 302 includes a gate terminal, a first source/drain (S/D) terminal, and a second S/D terminal. The gate terminal of PFET device 302 is electrically coupled to a control signal 320 (e.g., an enable signal). Control signal 320 can be generated by a control circuit in pre-charge circuit 110 of FIG. 1 (not shown). If control signal 320 is a '0' or a logic low value (e.g., ground or 0 V), PFET device 302 can turn "on." The first S/D terminal of PFET device 302 is electrically coupled (e.g., directly connected) to first reference voltage 314. The second S/D terminal of PFET device 302 is connected to a second S/D terminal of NFET device 304 and a second S/D terminal of PFET pass device 306.

NFET device 304 includes a gate terminal, a first S/D terminal, and a second S/D terminal. The gate terminal of NFET device 304 is electrically coupled to control signal 320. If control signal 320 is a '1' or a logic high value (e.g., a power supply voltage, such as 0.4 V, 0.6 V, 0.7 V, 1.0 V, 1.2 V, 1.8 V, 2.4 V, 3.3 V, 5 V, and any other suitable voltage), NFET device 304 can turn "on." The first S/D terminal of NFET device 304 is electrically coupled (e.g., directly connected) to a second reference voltage 316, such as ground or 0 V. The second S/D terminal of NFET device 304 is connected to the second S/D terminal of PFET device 302 and the second S/D terminal of PFET pass device 306.

PFET pass device 306 includes a gate terminal, a first S/D terminal, and a second S/D terminal. The gate terminal of the PFET device 306 is electrically coupled to control signal 320. If control signal 320 is a '0' or a logic low value, PFET pass device 306 can turn "on." The first S/D terminal of PFET pass device 306 is electrically coupled (e.g., directly connected) to the BL of memory cell 190. The second S/D terminal of PFET pass device 306 is connected to the second S/D terminal of PFET device 302 and the second S/D terminal of NFET device 304.

PFET device 308 includes a gate terminal, a first S/D terminal, and a second S/D terminal. The gate terminal of PFET device 308 is electrically coupled to control signal 320. If control signal 320 is a '0' or a logic low value, PFET device 308 can turn "on." The first S/D terminal of PFET device 308 is electrically coupled (e.g., directly connected) to first reference voltage 314. The second S/D terminal of PFET device 308 is connected to a second S/D terminal of NFET device 310 and a second S/D terminal of PFET pass device 312.

NFET device 310 includes a gate terminal, a first S/D terminal, and a second S/D terminal. The gate terminal of NFET device 310 is electrically coupled to control signal 320. If control signal 320 is a '1' or a logic high value, NFET device 310 can turn "on." The first S/D terminal of NFET device 310 is electrically coupled (e.g., directly connected) to second reference voltage 316. The second S/D terminal of NFET device 310 is connected to the second terminal of PFET device 308 and the second S/D terminal of PFET pass device 312.

PFET pass device 312 includes a gate terminal, a first S/D terminal, and a second S/D terminal. The gate terminal of the PFET device 312 is electrically coupled to control signal 320. If control signal 320 is a '0' or a logic low value, PFET pass device 312 can turn "on." The first S/D terminal of PFET pass device 312 is electrically coupled (e.g., directly connected) to the BLB of memory cell 190. The second S/D terminal of PFET pass device 312 is connected to the second S/D terminal of PFET device 308 and the second S/D terminal of NFET device 310.

During operation, if control signal 320 is a '0' or a logic low value, PFET devices 302 and 308 and PFET pass devices 306 and 312 are turned "on," while NFET devices 304 and 310 are turned "off." As a result, pre-charge cell 315 passes first reference voltage 314 to the bitline pair BL/BLB of memory cell 190, thus charging the bitline pair BL/BLB to a voltage level at or near first reference voltage 314. If control signal 320 is a '1' or a logic high value, PFET devices 302 and 308 and PFET pass devices 306 and 312 are turned "off," while NFET devices 304 and 310 are turned "on." As a result, pre-charge cell 315 does not pass first reference voltage 314 to the bitline pair BL/BLB of memory cell 190 and sets internal nodes—an internal node that connects the second S/D terminals of PFET device 302, PFET device 304, and PFET pass device 306 and another internal node that connects the second S/D terminals of PFET device 308, PFET device 310, and PFET pass device 312—to second reference voltage 316 (e.g., ground or 0 V).

Figure 4A:
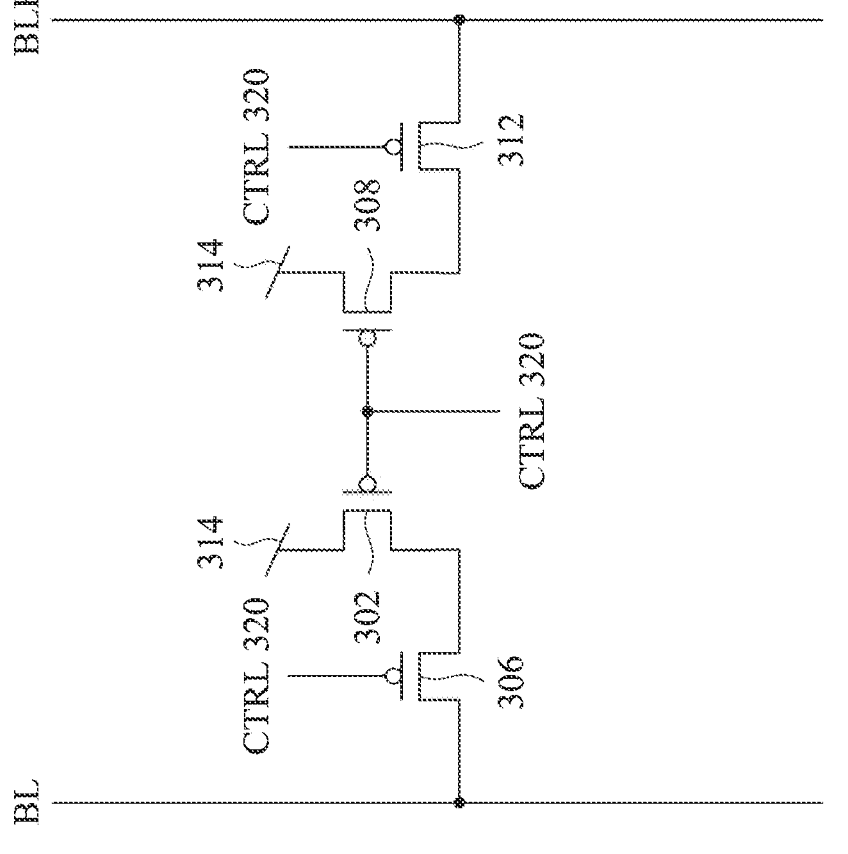
FIGS. 4A and 4B are illustrations of a second pre-charge cell topology and associated layout, respectively, according to some embodiments of the present disclosure.
Figure 4B:
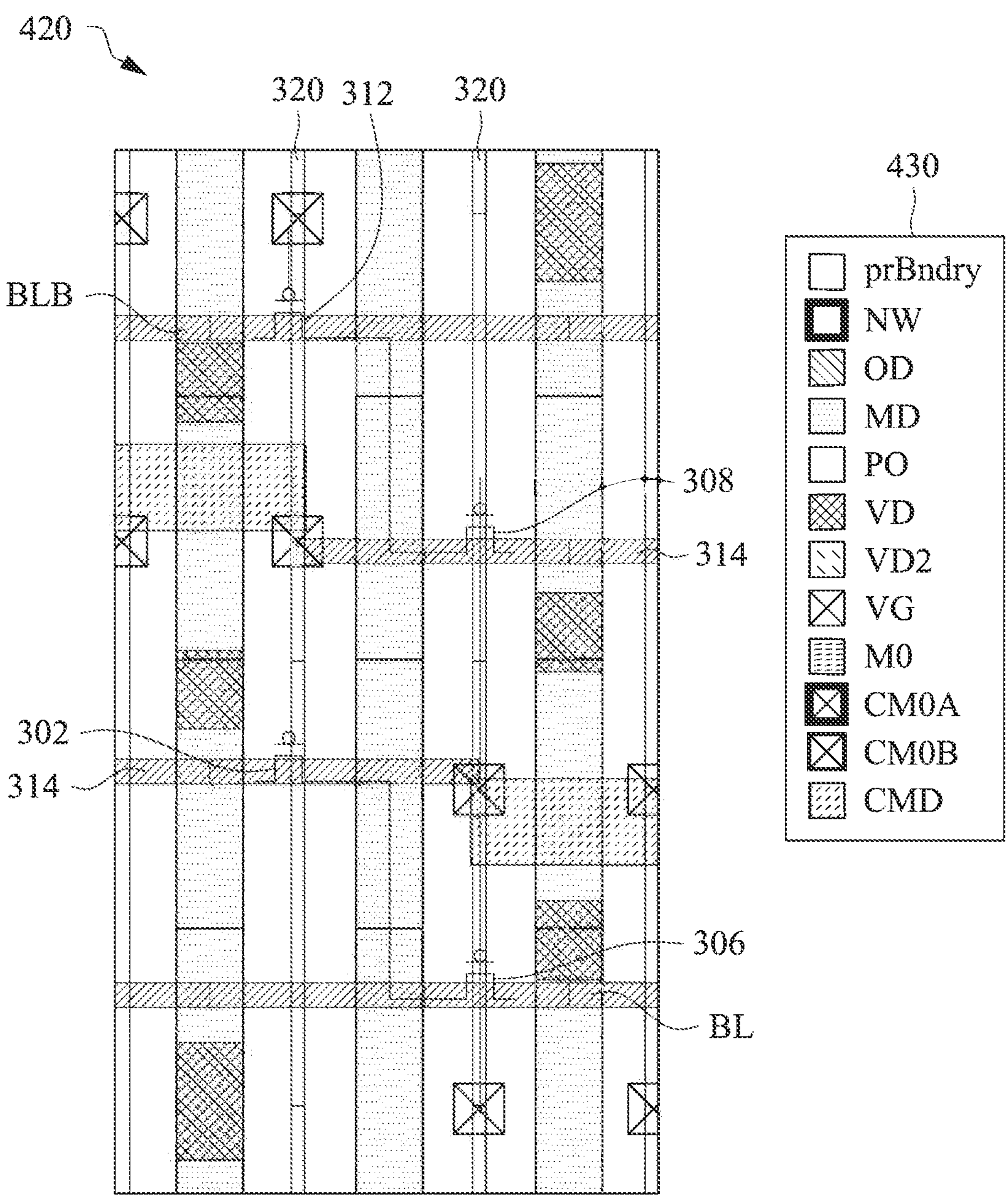

FIGS. 4A and 4B are illustrations of a pre-charge cell 415 and an associated layout, respectively, according to some embodiments. In some embodiments, pre-charge cells $\mathbf{115}_0$-$\mathbf{115}_N$ of FIG. 1 can each have the same circuit topology as pre-charge cell 415. In some embodiments, pre-charge cell 415 can be coupled to one or more memory cells, such as memory cells $\mathbf{190}_{00}$-$\mathbf{190}_{M0}$ in column '0' of SRAM array 180.

Pre-charge cell 415 charges the bitline pair BL/BLB of one or more memory cells to first reference voltage 314, such as a power supply voltage (e.g., 0.4 V, 0.6 V, 0.7 V, 1.0 V, 1.2 V, 1.8 V, 2.4 V, 3.3 V, 5 V, and any other suitable voltage), prior to a memory read operation and/or a memory write operation according to some embodiments. In some embodiments, pre-charge cell 415 includes PFET device 302, PFET pass device 306, PFET device 308, and PFET pass device 312.

Referring to PFET device 302 in FIG. 4A, the gate terminal of PFET device 302 is electrically coupled to control signal 320. If control signal 320 is a '0' or a logic low value, PFET device 302 can turn "on." The first S/D terminal of PFET device 302 is electrically coupled (e.g., directly connected) to first reference voltage 314. The second S/D terminal of PFET device 302 is connected to the second S/D terminal of PFET pass device 306.

Referring to PFET pass device 306, the gate terminal of the PFET device 306 is electrically coupled to control signal 320. If control signal 320 is a '0' or a logic low value, PFET pass device 306 can turn "on." The first S/D terminal of PFET pass device 306 is electrically coupled (e.g., directly connected) to a BL of a memory cell (e.g., memory cell 190). The second S/D terminal of PFET pass device 306 is connected to the second S/D terminal of PEST device 302.

Referring to PFET device 308, the gate terminal of PFET device 308 is electrically coupled to control signal 320. If control signal 320 is a '0' or a logic low value, PFET device 308 can turn "on." The first S/D terminal of PFET device 308 is electrically coupled (e.g., directly connected) to first reference voltage 314. The second S/D terminal of PFET device 308 is connected to the second S/D terminal of PFET pass device 312.

Referring to PFET pass device 312, the gate terminal of the PFET device 312 is electrically coupled to control signal 320. If control signal 320 is a '0' or a logic low value, PFET pass device 312 can turn "on." The first S/D terminal of PFET pass device 312 is electrically coupled (e.g., directly connected) to a BLB of the memory cell (e.g., memory cell 190). The second S/D terminal of PFET pass device 312 is connected to the second S/D terminal of PFET device 308.

During operation, if control signal 320 is a '0' or a logic low value, PFET devices 302 and 308 and PFET pass devices 306 and 312 are turned "on." As a result, pre-charge cell 415 passes first reference voltage 314 to the bitline pair BL/BLB of the memory cell, thus charging the bitline pair BL/BLB to a voltage level at or near first reference voltage 314. If control signal 320 is a '1' or a logic high value, PFET devices 302 and 308 and PFET pass devices 306 and 312 are turned "off." As a result, pre-charge cell 415 does not pass first reference voltage 314 to the bitline pair BL/BLB of the memory cell. In some embodiments, as compared to pre-charge cell 315 of FIG. 3 and since pre-charge cell 415 does not include NFET devices connected to second reference voltage 316 (e.g., ground or 0 V) that turn "on" and "off," pre-charge cell 415 can have a lower power consumption than pre-charge cell 315 because no current is drawn by NFET devices connected to second reference voltage 316 when control signal 320 toggles between '0' and '1'.

Referring to FIG. 4B, a layout 420 of pre-charge cell 415 and an associated layout legend 430 are shown, according to some embodiments. In some embodiments, layout legend 430 identifies various layers of pre-charge cell 415 and includes the following layers: prBndry (cell boundary layer); NW (N-well layer); OD (gate oxide and diffusion layer); MD (interconnection layer between OD and VD); PO (poly layer); VD (via layer on MD); VD2 (via layer 2 on MD); VG (via layer on gate); M0 (metal 0 layer); CM0A (cut metal 0 color A layer); CM0B (cut metal 0 color B layer); and CMD (cut MD layer).

Layout 420 is overlaid by the PET devices of pre-charge cell 415: PFET device 302, PFET pass device 306, PFET device 308, and PFET pass device 312. In layout 420, control signal 320 is connected to the gate terminals of all of the PFET devices through poly layers (PO layers), according to some embodiments. Further, in some embodiments, cut metal lines (e.g., cut MD) are between the BL and BLB to provide first reference voltage 314 (e.g., a power supply voltage, such as 0.4 V, 0.6 V, 0.7 V, 1.0 V, 1.2 V, 1.8 V, 2.4 V, 3.3 V, 5 V, and any other suitable voltage) to the S/D terminals of PFET devices 302 and 308. Further, because a single reference voltage (e.g., first reference voltage 314) is provided to pre-charge cell 415, layout 420 does not include multiple metal lines that provide other reference voltages (e.g., ground or 0 V), according to some embodiments.

Figure 5A:
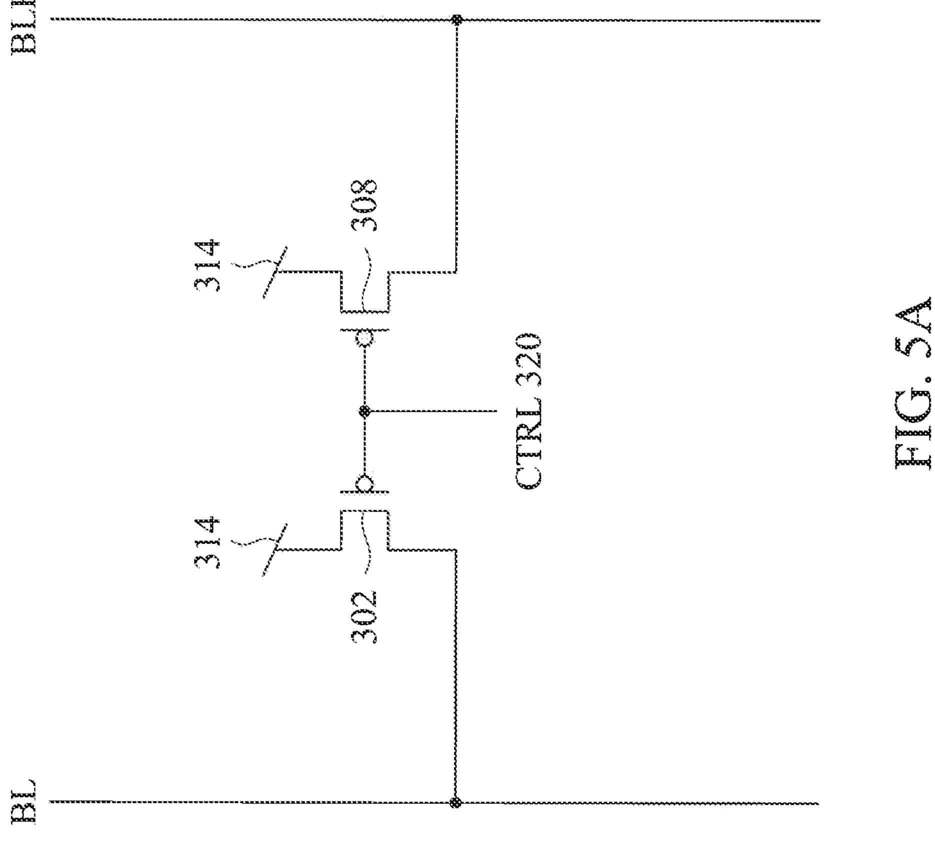
FIGS. 5A and 5B are illustrations of a third pre-charge cell topology and associated layout, respectively, according to some embodiments of the present disclosure.
Figure 5B:
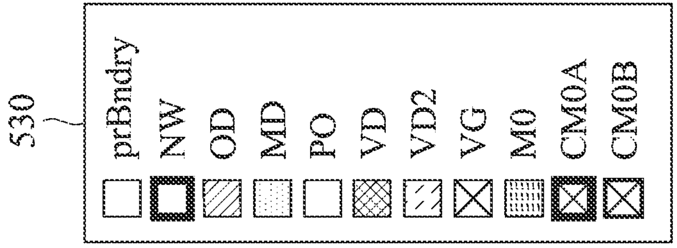
Figure 5B:
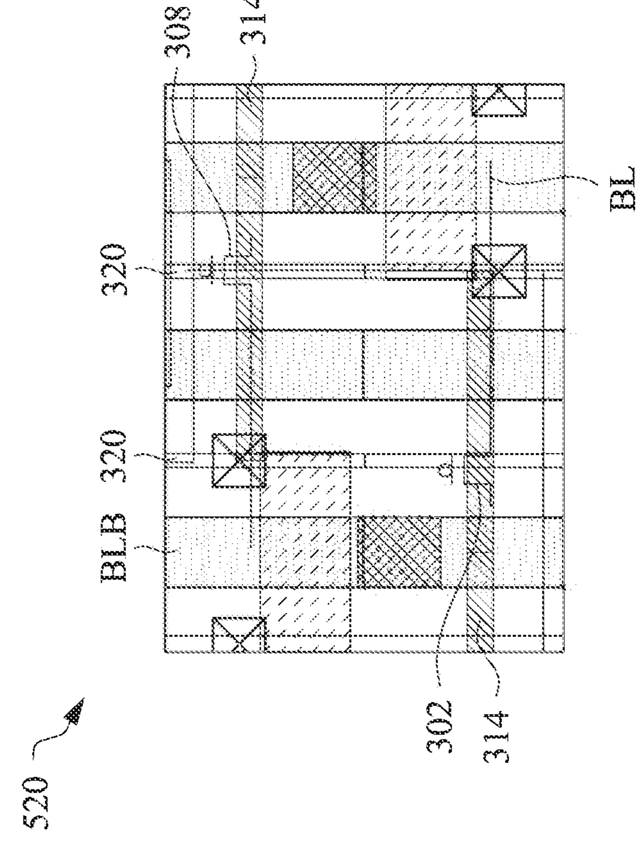

FIGS. 5A and 5B are illustrations of a pre-charge cell 515 and an associated layout, respectively, according to some embodiments. In some embodiments, pre-charge cells $\mathbf{115}_0$-$\mathbf{115}_N$ of FIG. 1 can each have the same circuit topology as pre-charge cell 515. In some embodiments, pre-charge cell 515 can be coupled to one or more memory cells, such as memory cells $190_{00}$-$190_{M0}$ in column '0' of SRAM array 180.

Pre-charge cell 515 charges the bitline pair BL/BLB of one or more memory cells to first reference voltage 314, such as a power supply voltage (e.g., 0.4 V, 0.6 V, 0.7 V, 1.0 V, 1.2 V, 1.8 V, 2.4 V, 3.3 V, 5 V, and any other suitable voltage), prior to a memory read operation and/or a memory write operation according to some embodiments. In some embodiments, pre-charge cell 515 includes PFET device 302 and PFET device 308.

Referring to PFET device 302 in FIG. 5A, the gate terminal of PFET device 302 is electrically coupled to control signal 320. If control signal 320 is a '0' or a logic low value, PFET device 302 can turn "on." The first S/D terminal of PFET device 302 is electrically coupled (e.g., directly connected) to first reference voltage 314. The second S/D terminal of PFET device 302 is connected to a BL of a memory cell (e.g., memory cell 190).

Referring to PPET device 308, the gate terminal of PFET device 308 is electrically coupled to control signal 320. If control signal 320 is a '0' or a logic low value, PFET device 308 can turn "on." The first S/D terminal of PFET device 308 is electrically coupled (e.g., directly connected) to first reference voltage 314. The second S/D terminal of PFET device 308 is connected to a BLB of the memory cell (e.g., memory cell 190).

During operation, if control signal 320 is a '0' or a logic low value, PFET devices 302 and 308 are turned "on." As a result, pre-charge cell 515 passes first reference voltage 314 to the bitline pair BL/BLB of the memory cell, thus charging the bitline pair BL/BLB to a voltage level at or near first reference voltage 314. If control signal 320 is a '1' or a logic high value, PFET devices 302 and 308 are turned "off." As a result, pre-charge cell 515 does not pass first reference voltage 314 to the bitline pair BL/BLB of the memory cell. In some embodiments, as compared to pre-charge cell 315 of FIG. 3 and since pre-charge cell 515 does not include NFET devices connected to second reference voltage 316 (e.g., ground or 0 V) that turn "on" and "off," pre-charge cell 515 can have a lower power consumption than pre-charge cell 315 because no current is drawn by NFET devices connected to second reference voltage 316 when control signal 320 toggles between '0' and '1'.

Referring to FIG. 5B, a layout 520 of pre-charge cell 515 and an associated layout legend 530 are shown, according to some embodiments. In some embodiments, layout legend 530 identifies various layers of pre-charge cell 515 and includes the following layers: prBndry (cell boundary layer); NW (N-well layer); OD (gate oxide and diffusion layer); MD (interconnection layer between OD and VD); PO (poly layer); VD (via layer on MD); VD2 (via layer 2 on MD); VG (via layer on gate); M0 (metal 0 layer); CM0A (cut metal 0 color A layer); and CM0B (cut metal 0 color B layer).

Layout 520 is overlaid by the FET devices of pre-charge cell 515: PFET devices 302 and 308. In layout 520, control signal 320 is connected to the gate terminals of all of the PFET devices through poly layers (PO layers), according to some embodiments. Because a single reference voltage (e.g., first reference voltage 314) is provided to pre-charge cell 515, layout 520 does not include multiple metal lines that provide other reference voltages (e.g., ground or 0 V), according to some embodiments. In some embodiments, as compared to pre-charge cell 415 of FIG. 4B and since pre-charge cell 515 does not include PFET pass devices (e.g., PFET pass devices 306 and 312), the layout of pre-charge cell 515 can be smaller than that of pre-charge cell 415.

Figure 6:
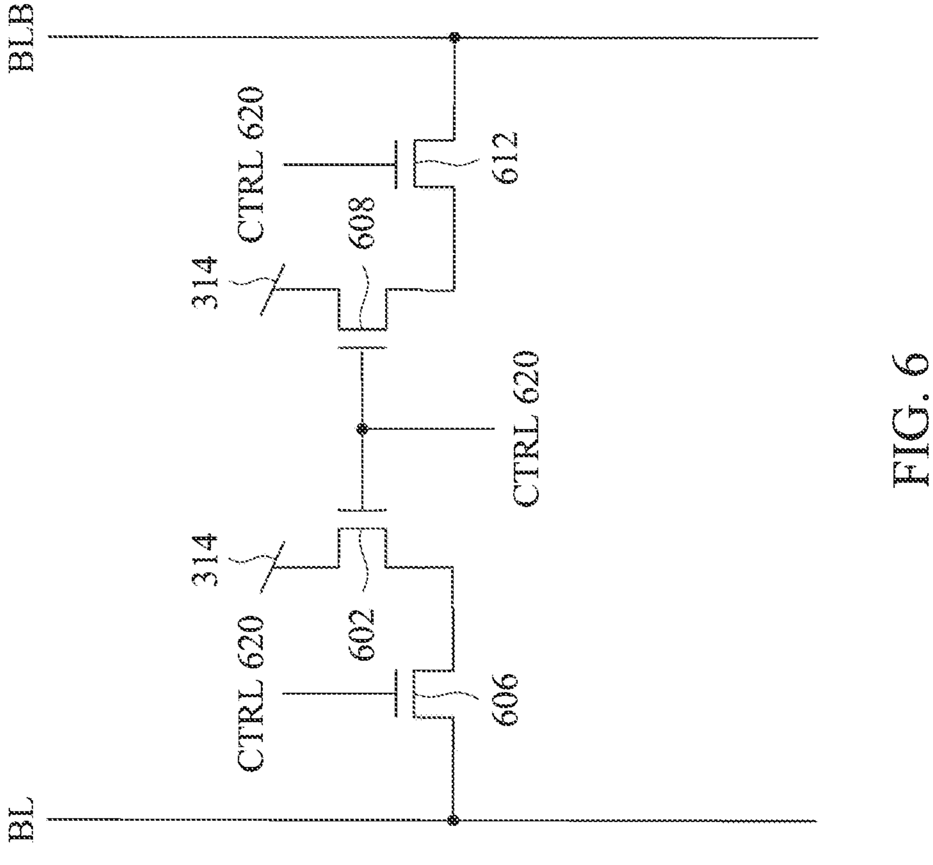
FIG. 6 is an illustration of a fourth pre-charge cell topology, according to some embodiments of the present disclosure.

FIG. 6 is an illustration of a pre-charge cell 615, according to some embodiments. In some embodiments, pre-charge cells $115_0$-$115_N$ of FIG. 1 can each have the same circuit topology as pre-charge cell 615. In some embodiments, pre-charge cell 415 can be coupled to one or more memory cells, such as memory cells $190_{00}$-$190_{M0}$ in column '0' of SRAM array 180.

Pre-charge cell 615 charges the bitline pair BL/BLB of one or more memory cells to first reference voltage 314, such as a power supply voltage (e.g., 0.4 V, 0.6 V, 0.7 V, 1.0 V, 1.2 V, 1.8 V, 2.4 V, 3.3 V, 5 V, and any other suitable voltage), prior to a memory read operation and/or a memory write operation according to some embodiments. In some embodiments, pre-charge cell 615 includes an NFET device 602, an NFET pass device 606, an NFET device 608, and an NFET pass device 612. The NFET devices can be planar metal-oxide-semiconductor FETs, finFETs, gate-all-around FETs, any suitable FETs, or combinations thereof.

NFET device 602 includes a gate terminal, a first S/D terminal, and a second S/D terminal. The gate terminal of NFET device 602 is electrically coupled to a control signal 620 (e.g., an enable signal). Control signal 620 can be generated by a control circuit in pre-charge circuit 110 of FIG. 1 (not shown). If control signal 620 is a '1' or a logic high value, NFET device 602 can turn "on." In some embodiments, the voltage level of the '1' or logic high value can be at a voltage level higher than first reference voltage 314 so that a voltage at or near first reference voltage 314 is passed from the first S/D terminal of NFET device 602 to the second S/D terminal of NFET device 602. The first S/D terminal of NFET device 602 is electrically coupled (e.g., directly connected) to first reference voltage 314. The second S/D terminal of NFET device 602 is connected to a second S/D terminal of NFET pass device 606.

NFET pass device 606 includes a gate terminal, a first S/D terminal, and a second S/D terminal. The gate terminal of NFET pass device 606 is electrically coupled to control signal 620. If control signal 620 is a '1' or a logic high value (e.g., a voltage level higher than first reference voltage 314 so that a voltage at or near first reference voltage 314 is passed from the second S/D terminal of NFET pass device 606 to the first S/D terminal of NFET pass device 606), NFET pass device 606 can turn "on." The first S/D terminal of NFET pass device 602 is electrically coupled (e.g., directly connected) to a BL of a memory cell (e.g., memory cell 190). The second S/D terminal of NFET pass device 606 is connected to the second S/D terminal of NFET device 602.

NFET device 608 includes a gate terminal, a first S/D terminal, and a second S/D terminal. The gate terminal of NFET device 608 is electrically coupled to control signal 620. If control signal 620 is a '1' or a logic high value (e.g., a voltage level higher than first reference voltage 314 so that a voltage at or near first reference voltage 314 is passed from the first S/D terminal of NFET device 608 to the second S/D terminal of NFET device 608), NFET device 608 can turn "on." The first S/D terminal of NFET device 608 is electrically coupled (e.g., directly connected) to first reference voltage 314. The second S/D terminal of NFET device 608 is connected to a second S/D terminal of NFET pass device 612.

NFET pass device 612 includes a gate terminal, a first S/D terminal, and a second S/D terminal. The gate terminal of NFET device 612 is electrically coupled to control signal 620. If control signal 620 is a '1' or a logic high value (e.g., a voltage level higher than first reference voltage 314 so that a voltage at or near first reference voltage 314 is passed from the second S/D terminal of NFET pass device 612 to the first S/D terminal of NFET pass device 612), NFET pass device 612 can turn "on." The first S/D terminal of NFET pass device 612 is electrically coupled (e.g., directly connected) to a BLB of the memory cell (e.g., memory cell 190). The second S/D terminal of NFET pass device 612 is connected to the second S/D terminal of NFET device 608.

During operation, if control signal 620 is a '1' or a logic high value (e.g., a voltage level higher than first reference voltage 314 so that a voltage at or near first reference voltage 314 is passed from the first S/D terminals of NFET devices 602 and 608 to the first S/D terminals of NFET pass devices 606 and 612), NFET devices 602 and 608 and NFET pass devices 606 and 612 are turned "on." As a result, pre-charge cell 615 passes first reference voltage 314 to the bitline pair BL/BLB of the memory cell, thus charging the bitline pair BL/BLB to a voltage level at or near first reference voltage 314. If control signal 620 is a '0' or a logic low value (e.g., ground or 0 V), NFET devices 602 and 608 and NFET pass devices 606 and 612 are turned "off." As a result, pre-charge cell 615 does not pass first reference voltage 314 to the bitline pair BL/BLB of the memory cell. In some embodiments, as compared to pre-charge cell 315 of FIG. 3 and since pre-charge cell 615 does not include NFET devices connected to second reference voltage 316 (e.g., ground or 0 V) that turn "on" and "off," pre-charge cell 615 can have a lower power consumption than pre-charge cell 315 because no current is drawn by NFET devices connected to second reference voltage 316 when control signal 620 toggles between '0' and '1'.

Figure 7:
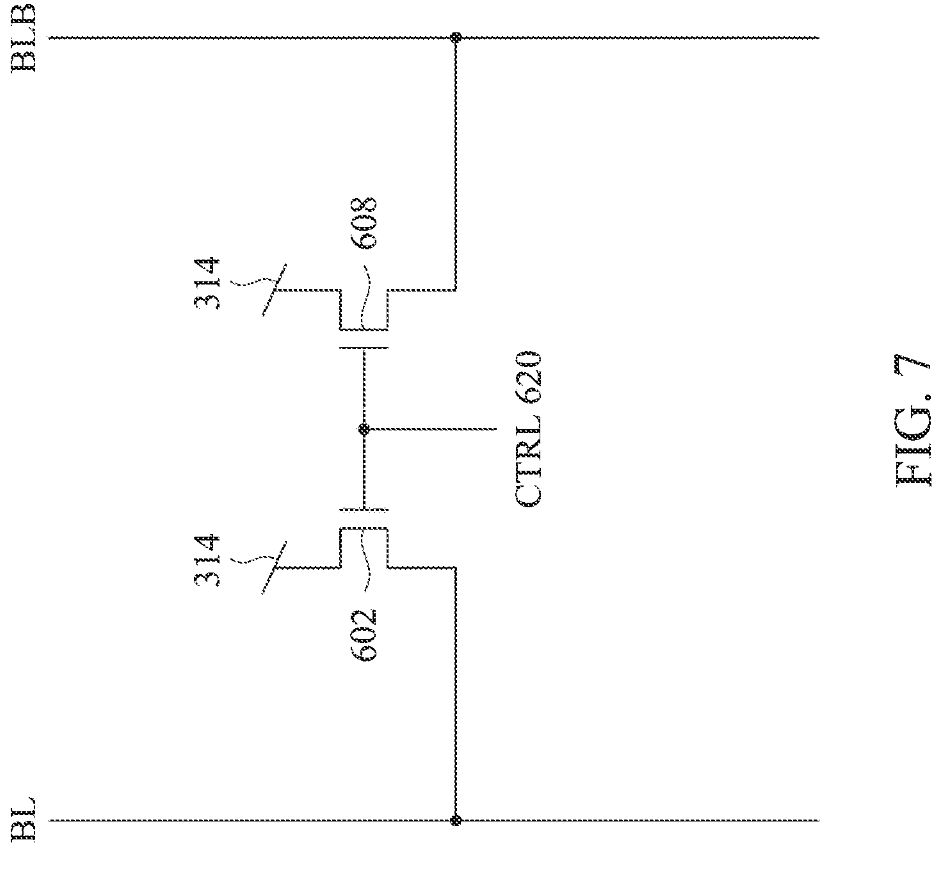
FIG. 7 is an illustration of a fifth pre-charge cell topology, according to some embodiments of the present disclosure.
Figure 7:
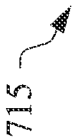

FIG. 7 is an illustration of a pre-charge cell 715, according to some embodiments. In some embodiments, pre-charge cells $115_0$-$115_N$ of FIG. 1 can each have the same circuit topology as pre-charge cell 715. In some embodiments, pre-charge cell 715 can be coupled to one or more memory cells, such as memory cells $190_{00}$-$190_{M0}$ in column '0' of SRAM array 180.

Pre-charge cell 715 charges the bitline pair BL/BLB of one or more memory cells to first reference voltage 314, such as a power supply voltage (e.g., 0.4 V, 0.6 V, 0.7 V, 1.0 V, 1.2 V, 1.8 V, 2.4 V, 3.3 V, 5 V, and any other suitable voltage), prior to a memory read operation and/or a memory write operation according to some embodiments. In some embodiments, pre-charge cell 715 includes NFET device 602 and NFET device 608.

Referring to NFET device 602, the gate terminal of NFET device 602 is electrically coupled to control signal 620. If control signal 620 is a '1' or a logic high value (e.g., a voltage level higher than first reference voltage 314 so that a voltage at or near first reference voltage 314 is passed from the first S/D terminal of NFET device 602 to the second S/D terminal of NFET device 602), NFET device 602 can turn "on." The first S/D terminal of NFET device 602 is electrically coupled (e.g., directly connected) to first reference voltage 314. The second S/D terminal of NFET device 602 is connected to a BL of a memory cell (e.g., memory cell 190).

Referring to NFET device 608, the gate terminal of NFET device is electrically coupled to control signal 620. If control signal 620 is a '1' or a logic high value (e.g., a voltage level higher than first reference voltage 314 so that a voltage at or near first reference voltage 314 is passed from the first S/D terminal of NFET device 608 to the second S/D terminal of NFET device 608), NFET device 608 can turn "on." The first S/D terminal of NFET device 608 is electrically coupled (e.g., directly connected) to first reference voltage 314. The second S/D terminal of NFET device 608 is connected to a BLB of the memory cell (e.g., memory cell 190).

During operation, if control signal 620 is a '1' or a logic high value (e.g., a voltage level higher than first reference voltage 314 so that a voltage at or near first reference voltage 314 is passed from the first S/D terminals of NFET devices 602 and 608 to the second. S/D terminals of NFET devices 602 and 618), NFET devices 602 and 608 are turned "on." As a result, pre-charge cell 715 passes first reference voltage 314 to the bitline pair BL/BLB of the memory cell, thus charging the bitline pair BL/BLB to a voltage level at or near first reference voltage 314. If control signal 620 is a '0' or a logic low value (e.g., ground or 0 V), NFET devices 602 and 608 are turned "off." As a result, pre-charge cell 715 does not pass first reference voltage 314 to the bitline pair BL/BLB of the memory cell. In some embodiments, as compared to pre-charge cell 315 of FIG. 3 and since pre-charge cell 715 does not include NFET devices connected to second reference voltage 316 (e.g., ground or 0 V) that turn "on" and "off," pre-charge cell 715 can have a lower power consumption than pre-charge cell 315 because no current is drawn by NFET devices connected to second reference voltage 316 when control signal 620 toggles between '0' and '1'. Also, as compared to pre-charge cell 615 of FIG. 6 and since pre-charge cell 715 does not include NFET pass devices (e.g., NFET pass devices 606 and 612), the layout of pre-charge cell 715 can be smaller than that of pre-charge cell 615, according to some embodiments.

Figure 8:
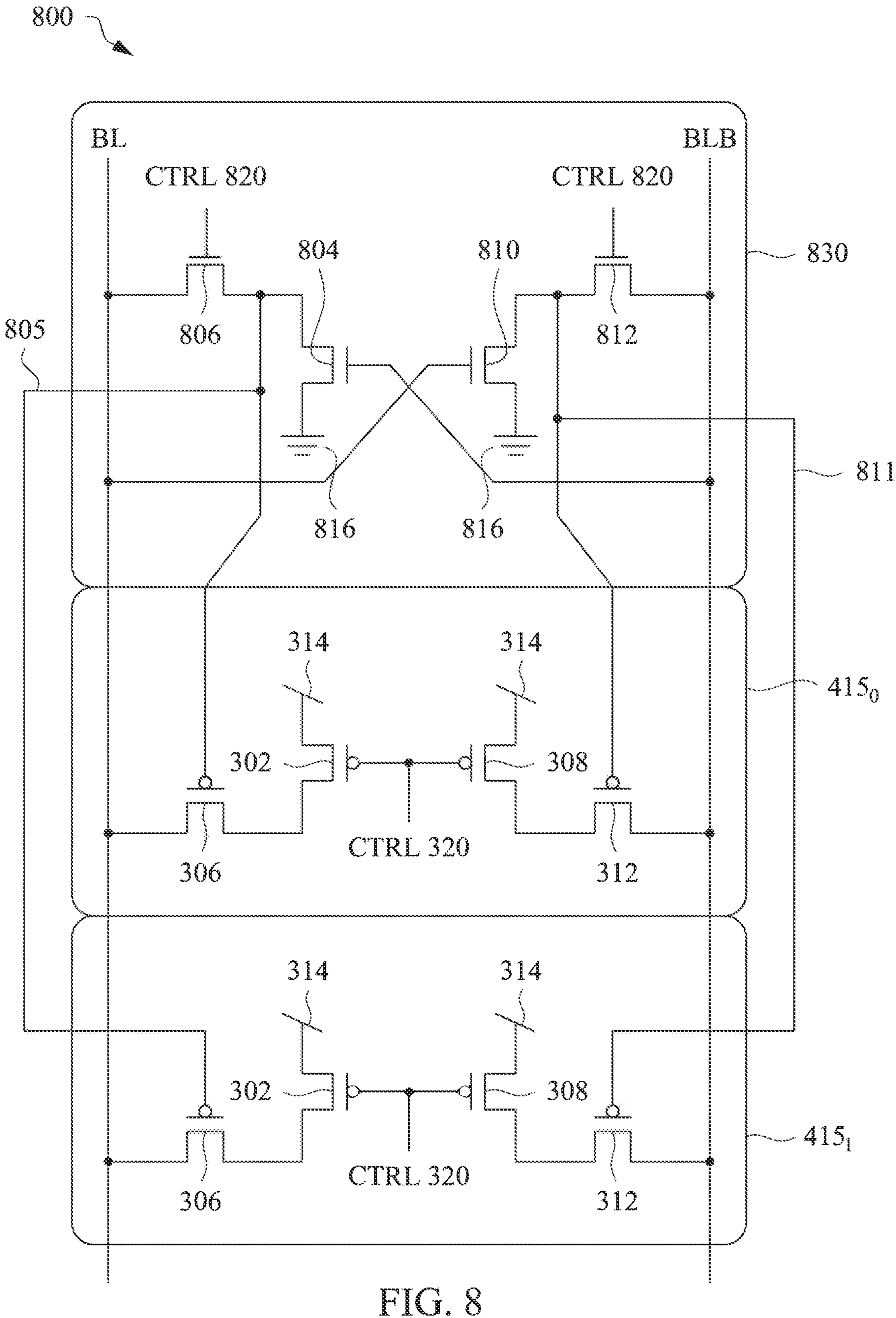
FIG. 8 is an illustration of a first pre-charge circuit architecture with multiple pre-charge cells and a write assist cell, according to some embodiments of the present disclosure.

FIG. 8 is an illustration of a pre-charge circuit architecture 800 with multiple pre-charge cells and a write assist cell, according to some embodiments. Pre-charge circuit architecture 800 includes a write assist cell 830, a pre-charge cell $415_0$, and a pre-charge cell $415_1$. As shown in FIG. 8, write assist cell 830 and pre-charge cells $415_0$ and $415_1$ can be arranged in a stacked configuration and coupled to a bitline pair BL/BLB of a memory cell (e.g., memory cell 190). In some embodiments, the stacked configuration of write assist cell 830 and pre-charge cells $415_0$ and $415_1$ can be coupled to more than one memory cell, such as memory cells $190_{00}$-$190_{M0}$ in column '0' of SRAM array 180.

Write assist cell 830 sets the bitline pair BL/BLB of one or more memory cells to a predetermined voltage to assist with a memory write operation. In some embodiments, the predetermined voltage can be a voltage at or near ground or 0 V. In some embodiments, the predetermined voltage can be a voltage less than a threshold voltage of NFET devices (e.g., NFET devices 804 and 810 discussed below). In some embodiments, the predetermined voltage can be a voltage lower than ground or 0 V. In some embodiments, write assist cell 830 includes an NFET device 804, an NFET pass device 806, an NFET device 810, and an NFET pass device 812. The NFET devices can be planar metal-oxide-semiconductor FETs, finFETs, gate-all-around FETs, any suitable FETs, or combinations thereof.

NFET device 804 includes a gate terminal, a first S/D terminal, and a second S/D terminal. The gate terminal of NFET device 804 is electrically coupled (e.g., directly connected) to a BLB of a memory cell memory cell 190). The first S/D terminal of NFET device 804 is electrically coupled to a reference voltage 816, such as ground or 0 V and a voltage less than 0 V. The second S/D terminal of NFET device 804 is connected to a second S/D terminal of NFET pass device 806.

NFET pass device 806 includes a gate terminal, a first S/D terminal, and a second S/D terminal. The gate terminal of NFET pass device 806 is electrically connected to a control signal 820 (e.g., an enable signal). Control signal 820 can be generated by a control circuit in pre-charge circuit 110 of FIG. 1 (not shown). If control signal 820 is a '1' or a logic high value (e.g., a power supply voltage, such as 0.4 V, 0.6 V, 0.7 V, 1.0 V, 1.2 V, 1.8 V, 2.4 V, 3.3 V, 5 V, and any other suitable voltage), NFET device 806 can turn "on." In some embodiments, control signal 820 of write assist cell 830 can be the same as control signal 320 of pre-charge cells $\mathbf{415_0}$ and $\mathbf{415_1}$ such that (i) if control signal 820 is a '1' or a logic high value, then PFET devices 302 and 308 of pre-charge cells $\mathbf{415_0}$ and $\mathbf{415_1}$ are turned "off" and (ii) if control signal 820 is a '0' or a logic low value (e.g., ground or 0 V), then PFET devices 302 and 308 of pre-charge cells $\mathbf{415_0}$ and $\mathbf{415_1}$ are turned "on" and NFET pass devices 806 and 812 of write assist cell 830 are turned "off." The first S/D terminal of NFET pass device 806 is electrically coupled (e.g., directly connected) to a BL of the memory cell (e.g., memory cell 190). The second S/D terminal of NFET pass device 806 is connected to the second S/D terminal of NFET device 804.

NFET device 810 includes a gate terminal, a first S/D terminal, and a second S/D terminal. The gate terminal of NFET device 810 is electrically coupled (e.g., directly connected) to the BLB of the memory cell (e.g., memory cell 190). The first S/D terminal of NFET device 810 is electrically coupled to reference voltage 8116. The second S/D terminal of NFET device 810 is connected to a second S/D terminal of NFET pass device 812.

NFET pass device 812 includes a gate terminal, a first S/D terminal, and a second S/D terminal. The gate terminal of NFET pass device 823 is electrically connected to control signal 820. If control signal 820 is a '1' or a logic high value, NFET pass device 812 can turn "on." The first S/D terminal of NFET pass device 812 is electrically coupled (e.g., directly connected) to the BLB of the memory cell (e.g., memory cell 190). The second S/D terminal of NFET pass device 812 is connected to the second S/D terminal of NFET device 810.

Referring to pre-charge cells $\mathbf{415_0}$ and $\mathbf{415_1}$, the S/D terminal connections of PFET device 302, PFET pass device 306, PFET device 308, and PFET pass device 312 are the same as described above with respect to FIG. 4A. In some embodiments, the gate terminal connections of PFET device 302, PFET pass device 306, PFET device 308, and PFET pass device 312 are different from the connections shown in FIG. 4A. For example, the gate terminals of PFET devices 302 and 308 are electrically coupled to control signal 820. Further, in some embodiments the gate terminals of PFET pass devices 306 and 312 are connected to nodes 805 and 811, respectively. Referring to FIG. 8, node 805 is a circuit node that is electrically connected to the second S/D terminals of NFET device 804 and NFET pass device 806. Node 811 is a circuit node that is electrically connected to the second S/D terminals of NFET device 810 and NFET pass device 812.

During operation, if control signal 820 is a '1' or a logic high value, NFET pass devices 806 and 812 in write assist cell 830 are turned "on" and PFET devices 302 and 308 in pre-charge cells $\mathbf{415_0}$ and $\mathbf{415_1}$ are turned "off." If the voltage levels on the bitline pair BL/BLB of the memory cell are at a voltage level sufficient to turn "on" NFET devices 804 and 810 in write assist cell 830 (e.g., the gate-to-source voltage of MITT devices 804 and 810 is higher than the threshold voltage of NFET devices 804 and 810), then the voltage levels on the bitline pair BL/BLB will be set to a voltage level at or near reference voltage 816 (e.g., ground or 0 V or a voltage less than 0 V) or to a voltage level less than the threshold voltage of NFET devices 804 and 810. If control signal 820 is a '0' or a logic low value, NFET pass devices 806 and 812 in write assist cell 830 are turned "off" and PFET devices 302 and 308 in pre-charge cells $\mathbf{415_0}$ and $\mathbf{415_1}$ are turned "on." If the voltage levels at nodes 805 and 811 are at a voltage level sufficient to turn "on" PFET pass devices 306 and 312 in pre-charge cells $\mathbf{415_0}$ and $\mathbf{415_1}$ (e.g., the gate-to-source voltage of PFET pass devices 306 and 312 is less than the threshold voltage of PFET pass devices 306 and 312), then the voltage levels on the bitline pair BL/BLB will be set to a voltage level at or near first reference voltage 314.

Figure 9:
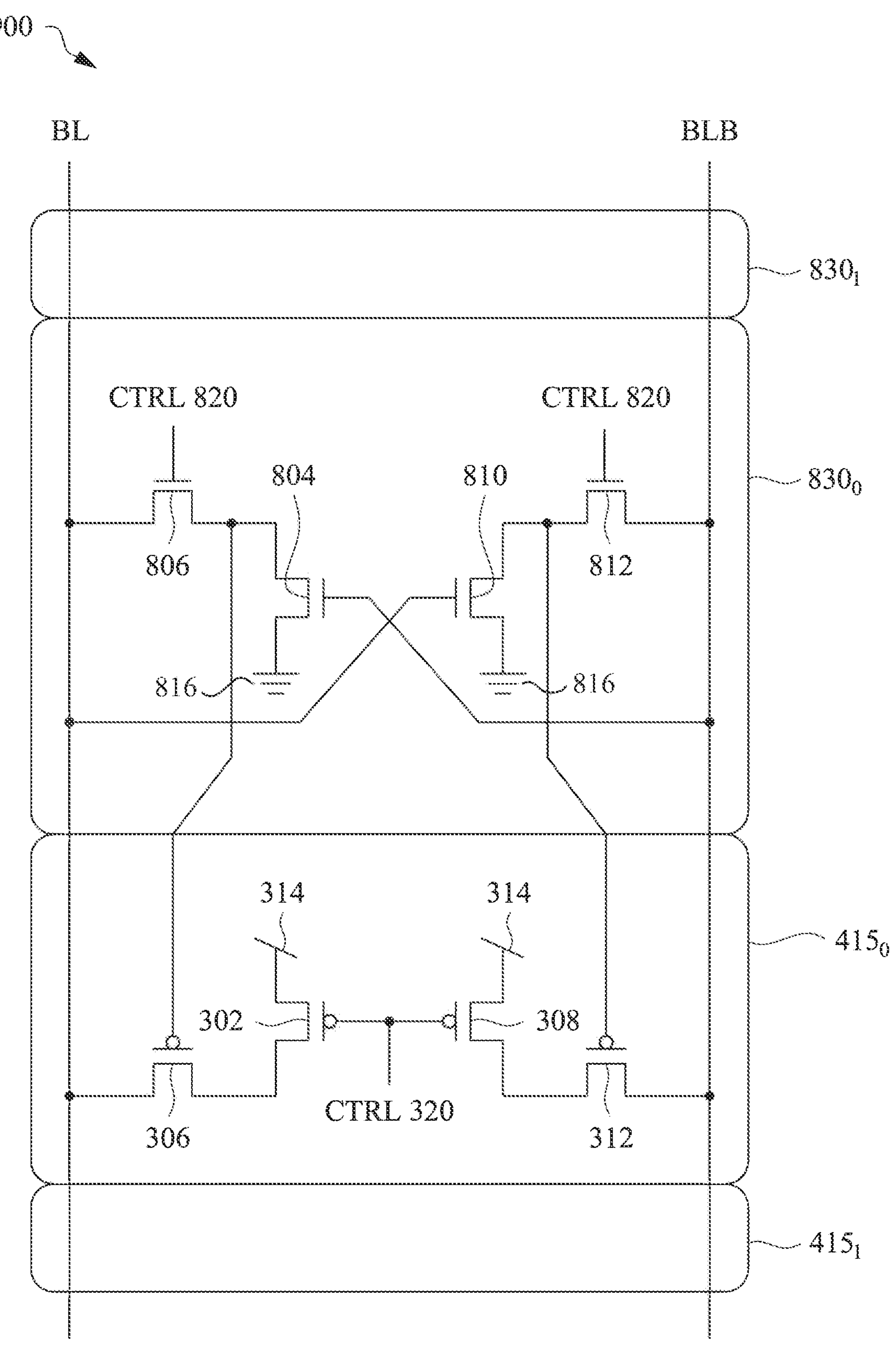
FIG. 9 is an illustration of a second pre-charge circuit architecture with multiple pre-charge cells and multiple write assist cells, according to some embodiments of the present disclosure.

The pre-charge circuit architecture is not limited to the stacked configuration of one write assist cell and two pre-charge cells shown in FIG. 8. In some embodiments, the pre-charge circuit architecture can include multiple pre-charge cells and multiple write assist cells to provide an adjustable pre-charge and write assist strength to the one or more memory cells (e.g., memory cells $\mathbf{190_{00}}$-$\mathbf{190_{M0}}$ in column '0' of SRAM array 180) coupled to the pre-charge circuit architecture. FIG. 9 is an illustration of a pre-charge circuit architecture 900 with multiple pre-charge cells and multiple write assist cells, according to some embodiments. Pre-charge circuit architecture 900 includes a write assist cell $\mathbf{830_0}$, a write assist cell $\mathbf{830_1}$, pre-charge cell $\mathbf{415_0}$, and pre-charge cell $\mathbf{415_1}$. As shown in FIG. 9, write assist cells $\mathbf{830_0}$ and $\mathbf{830_1}$ and pre-charge cells $\mathbf{415_0}$ and $\mathbf{415_1}$ can be arranged in a stacked configuration and coupled to a bitline pair BL/BLB of a memory cell (e.g., memory cell 190). In some embodiments, the stacked configuration of write assist cells $\mathbf{830_0}$ and $\mathbf{830_1}$ and pre-charge cells $\mathbf{415_0}$ and $\mathbf{415_1}$ can be coupled to more than one memory cell, such as memory cells $\mathbf{190_{00}}$-$\mathbf{190_{M0}}$ in column '0' of SRAM array 180. The gate and S/D terminal connections in write assist cells $\mathbf{830_0}$ and $\mathbf{830_1}$ and pre-charge cells $\mathbf{415_0}$ and $\mathbf{415_1}$ are similar to those connections described above with respect to FIG. 8.

Figure 10:
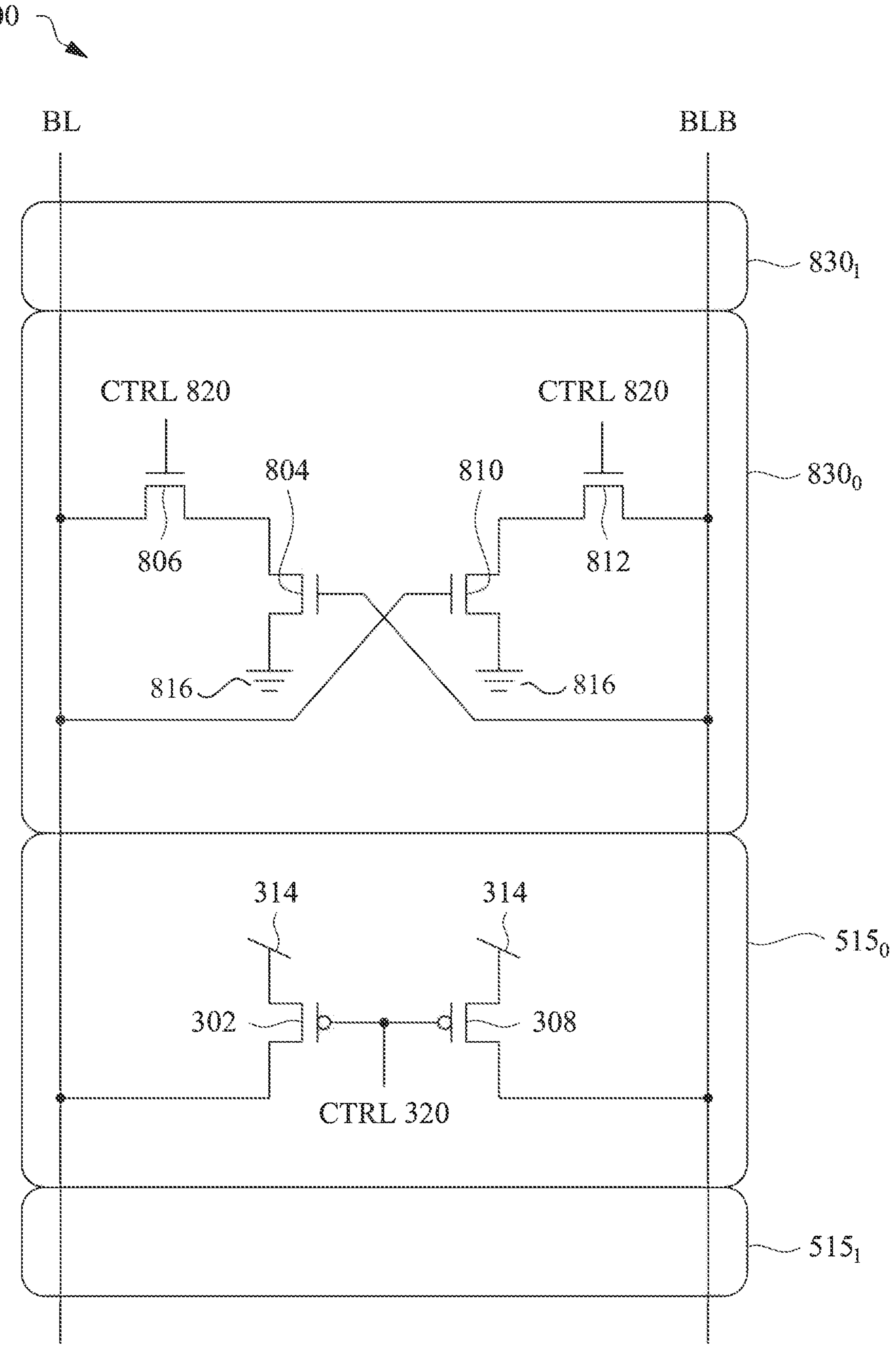
FIG. 10 is an illustration of a third pre-charge circuit architecture with multiple pre-charge cells and multiple write assist cells, according to some embodiments of the present disclosure.

Also, the pre-charge circuit architecture is not limited to the pre-charge cell shown in FIG. 8. In some embodiments, other pre-charge cells can be used, such as pre-charge cells 315, 515, 615, and 715 described above with respect to FIGS. 3, 5A, 6, and 7, respectively. For example, FIG. 10 is an illustration of a pre-charge circuit architecture 1000 with multiple pre-charge cells 515 and multiple write assist cells 830, according to some embodiments. Pre-charge circuit architecture 1000 includes a write assist cell $\mathbf{830_0}$, a write assist cell $\mathbf{830_1}$, a pre-charge cell $\mathbf{515_0}$, and a pre-charge cell $\mathbf{515_1}$.

Referring to pre-charge cells $\mathbf{515_0}$ and $\mathbf{515_1}$, the S/D terminal connections of PFET devices 302 and 308 are the same as described above with respect to FIG. 5A. In some embodiments, the gate terminal connections of PFET devices 302 and 308 are different from the connections shown in FIG. 5A. In some embodiments, the gate terminal connections of PFET devices 302 and 308 are electrically coupled to control signal 820. During operation, if control signal 820 is a '1' or a logic high value, NFET pass devices 806 and 812 in write assist cell 830 are turned "on" and PFET devices 302 and 308 in pre-charge cells $\mathbf{515_0}$ and $\mathbf{515_1}$ are turned "off." If the voltage levels on the bitline pair BL/BLB of the memory cell are at a voltage level sufficient to turn "on" NFET devices 804 and 810 in write assist cell 830 (e.g., the gate-to-source voltage of NFET devices 804 and 810 is higher than the threshold voltage of NFET devices 804 and 810), then the voltage levels on the bitline pair BL/BLB will be set to a voltage level at or near reference voltage 816 (e.g., ground or 0 V or a voltage less than 0 V) or to a voltage level less than the threshold voltage of NFET devices 804 and 810. If control signal 820 is a '0' or a logic low value, NFET pass devices 806 and 812 in write assist cell 830 are turned "off" and PFET devices 302 and 308 in pre-charge cells $\mathbf{415}_0$ and $\mathbf{415}_1$ are turned "on," thus setting the voltage levels on the bitline pair BL/BLB to a voltage level at or near first reference voltage 314.

Figure 11A:
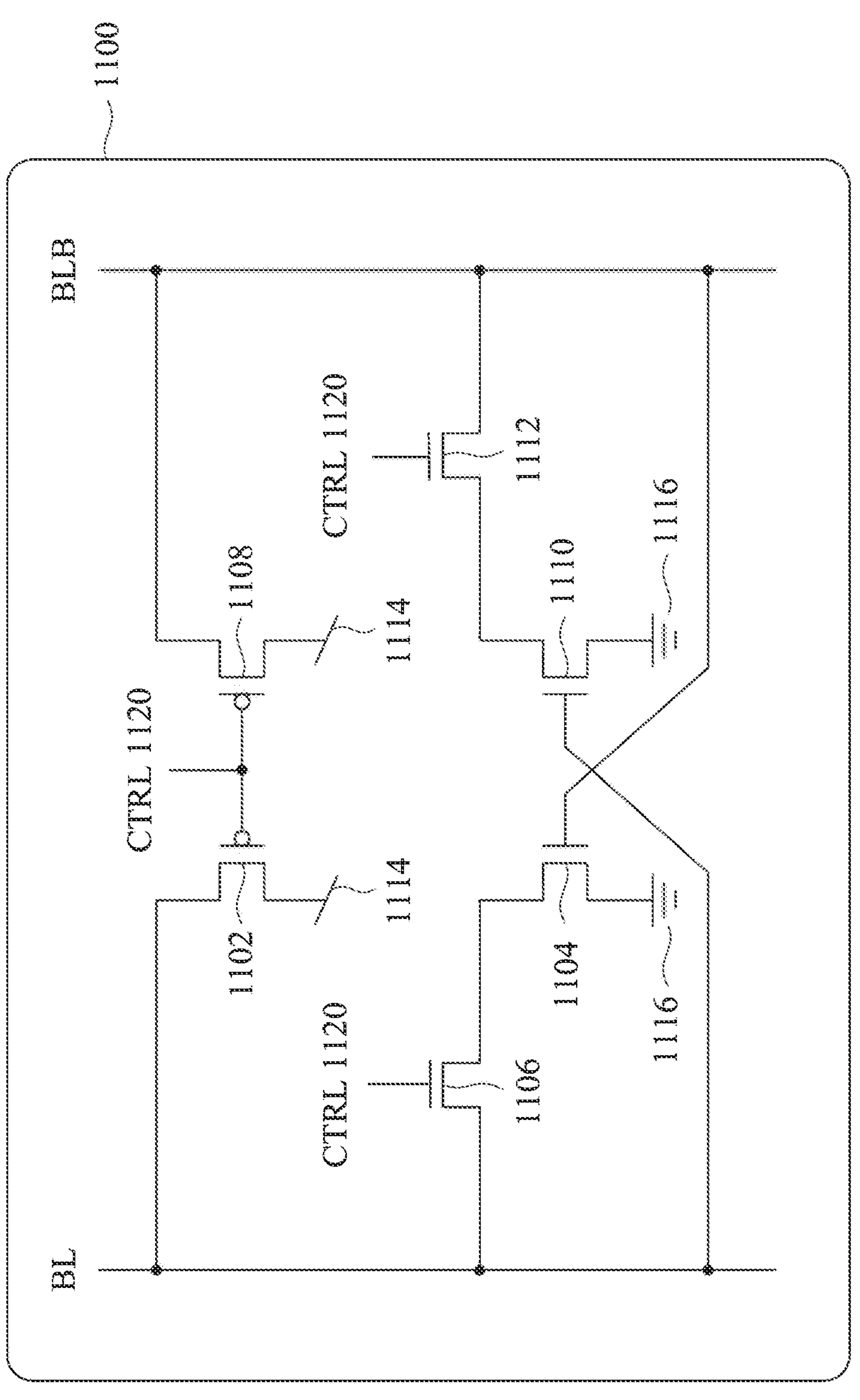
FIGS. 11A and 11B are illustrations of a combined pre-charge cell and write assist cell and an associated layout, respectively, according to some embodiments of the present disclosure.
Figure 11B:
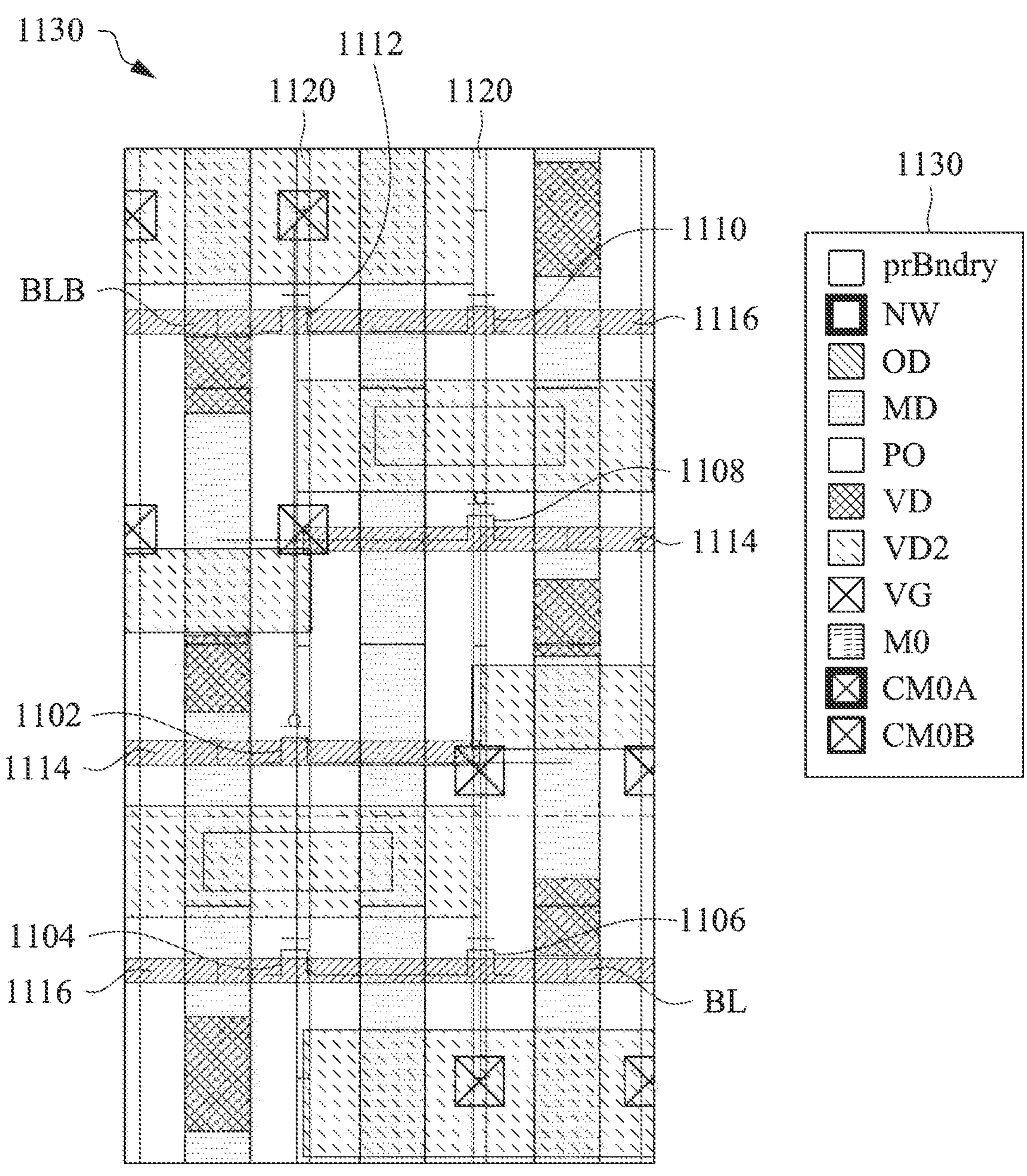

Further, in some embodiments, the pre-charge cell and write-assist cell can be combined into a single cell. FIGS. 11A and 11B are illustrations of a combined pre-charge cell and write assist cell 1100 and an associated layout, respectively, according to some embodiments. The combined pre-charge cell and write assist cell is also referred to herein as "combined pre-charge/write-assist cell 1100." In some embodiments, combined pre-charge/write-assist cell 1100 can be coupled to one or more memory cells, such as memory cells $\mathbf{190}_{00}$-$\mathbf{190}_{M0}$ in column '0' of SRAM array 180. Combined pre-charge/write-assist cell 1100 includes a PFET device 1102, an NFET device 1104, an NFET pass device 1106, a PFET device 1108, an NFET device 1110, and an NFET pass device 1112. The FET devices (e.g., NFET devices and PFET devices) can be planar metal-oxide-semiconductor FETs, finFETs, gate all-around FETs, any suitable FETs, or combinations thereof.

PFET device 1102 includes a gate terminal, a first S/D terminal, and a second S/D terminal. The gate terminal of PFET device 1102 is electrically coupled to a control signal 1120 (e.g., an enable signal). Control signal 1120 can be generated by a control circuit in pre-charge circuit 110 of FIG. 1 (not shown). If control signal 1120 is a '0' or a logic low value (e.g., ground or 0 V), PFET device 1102 can turn "on." The first S/D terminal of PFET device 1102 is electrically coupled (e.g., directly connected) to a BL of a memory cell (e.g., memory cell 190). The second S/D terminal of PFET device 1102 is electrically coupled to a first reference voltage 1114, such as a power supply voltage (e.g., 0.4 V, 0.6 V, 0.7 V, 1.0 V, 1.2 V, 1.8 V, 2.4 V, 3.3 V, 5 V, and any other suitable voltage).

NFET device 1104 includes a gate terminal, a first S/D terminal, and a second S/D terminal. The gate terminal of NFET device 1104 is electrically coupled (e.g., directly connected) to a BLB of the memory cell (e.g., memory cell 190). The first S/D terminal of NFET device 1104 is electrically coupled to a second reference voltage 1116, such as ground or 0 V. The second S/D terminal of NFET device 1104 is connected to a second S/D terminal of NFET pass device 1106.

NFET pass device 1106 includes a gate terminal, a first S/D terminal, and a second S/D terminal. The gate terminal of NFET pass device 1106 is electrically coupled to control signal 1120. If control signal 1120 is a '1' or a logic high value (e.g., a power supply voltage, such as 0.4 V, 0.6 V, 0.7 V, 1.0 V, 1.2 V, 1.8 V, 2.4 V, 3.3 V, 5 V, and any other suitable voltage), NFET pass device 1106 can turn "on." The first S/D terminal of NFET pass device 1106 is connected to the BL of the memory cell (e.g., memory cell 190). The second S/D terminal of NFET pass device 1106 is connected to the second S/D terminal of NFET device 1104.

PFET device 1108 includes a gate terminal, a first S/D terminal, and a second S/D terminal. The gate terminal of PFET device 1108 is electrically coupled to control signal 1120. If control signal is a '0' or a logic low value (e.g., ground or 0 V), PFET device 1108 can turn "on." The first S/D terminal of PFET device 1108 is electrically coupled (e.g., directly connected) to the BLB of the memory cell (e.g., memory cell 190). The second S/D terminal of PFET device 1108 is electrically coupled to first reference voltage 1114.

NFET device 1110 includes a gate terminal, a first S/D terminal, and a second S/D terminal. The gate terminal of NFET device 1110 is electrically coupled (e.g., directly connected) to the BL of the memory cell (e.g., memory cell 190). The first S/D terminal of NFET device 1110 is electrically coupled to second reference voltage 1116. The second S/D terminal of NFET device 1110 is connected to a second S/D terminal of NFET pass device 1112.

NFET pass device 1112 includes a gate terminal, a first S/D terminal, and a second S/D terminal. The gate terminal of NFET pass device 1112 is electrically coupled to control signal 1120. If control signal 1120 is a '1' or a logic high value, NFET pass device 1112 can turn "on." The first S/D terminal of NFET pass device 1112 is connected to the BLB of the memory cell (e.g., memory cell 190). The second S/D terminal of NFET pass device 1112 is connected to the second S/D terminal of NFET device 1110.

During operation, if control signal 1120 is a '1' or a logic high value, PFET devices 1102 and 1108 are turned "off" and NFET pass devices 1106 and 1112 are turned "on." If the voltage levels on the bitline pair BL/BLB of the memory cell are at a voltage level sufficient to turn "on" NFET devices 1104 and 1110 (e.g., the gate-to-source voltage of NFET devices 1104 and 1110 is higher than the threshold voltage of NFET devices 1104 and 1110), then the voltage levels on the bitline pair BL/BLB will be set to a voltage level at or near reference voltage 1116 (e.g., ground or 0 V) or to a voltage level less than the threshold voltage of NFET devices 1104 and 1110. If control signal 1120 is a '0' or a logic low value, NFET pass devices 1106 and 1112 are turned "off" and PFET devices 1102 and 1108 are turned "on." As a result, first reference voltage 1114 is passed to the bitline pair BL/BLB.

Referring to FIG. 11B, a layout 1130 of combined pre-charge/write-assist cell 1100 and an associated layout legend 1130 are shown, according to some embodiments. In some embodiments, layout legend 1130 identifies various layers of combined pre-charge/write-assist cell 1100 and includes the following layers: prBndry (cell boundary layer); NW (N-well layer); OD (gate oxide and diffusion layer); MD (interconnection layer between OD and VD); PO (poly layer); VD (via layer on MD); VD2 (via layer 2 on MD); VG (via layer on gate); M0 (metal 0 layer); CM0A (cut metal 0 color A layer); and CM0B (cut metal 0 color B layer).

Layout 1130 is overlaid by FET devices of combined pre-charge/write-assist cell 1100: PFET device 1102, NFET device 1104, NFET pass device 1106, PFET device 1108, NFET device 1110, and NFET pass device 1112. In layout 1130, control signal 1120 is connected to the gate terminals of PFET devices 1102 and 1108 through poly layers (PO layers), according to some embodiments. Further, in some embodiments, cut metal lines (e.g., cut MD) are between the BL and BLB to provide first reference voltage 1114 (e.g., a power supply voltage, such as 0.4 V, 0.6 V, 0.7 V, 1.0 V, 1.2 V, 1.8 V, 2.4 V, 3.3 V, 5 V, and any other suitable voltage) to the S/D terminals of PFET devices 1102 and 1108.

Figure 12:
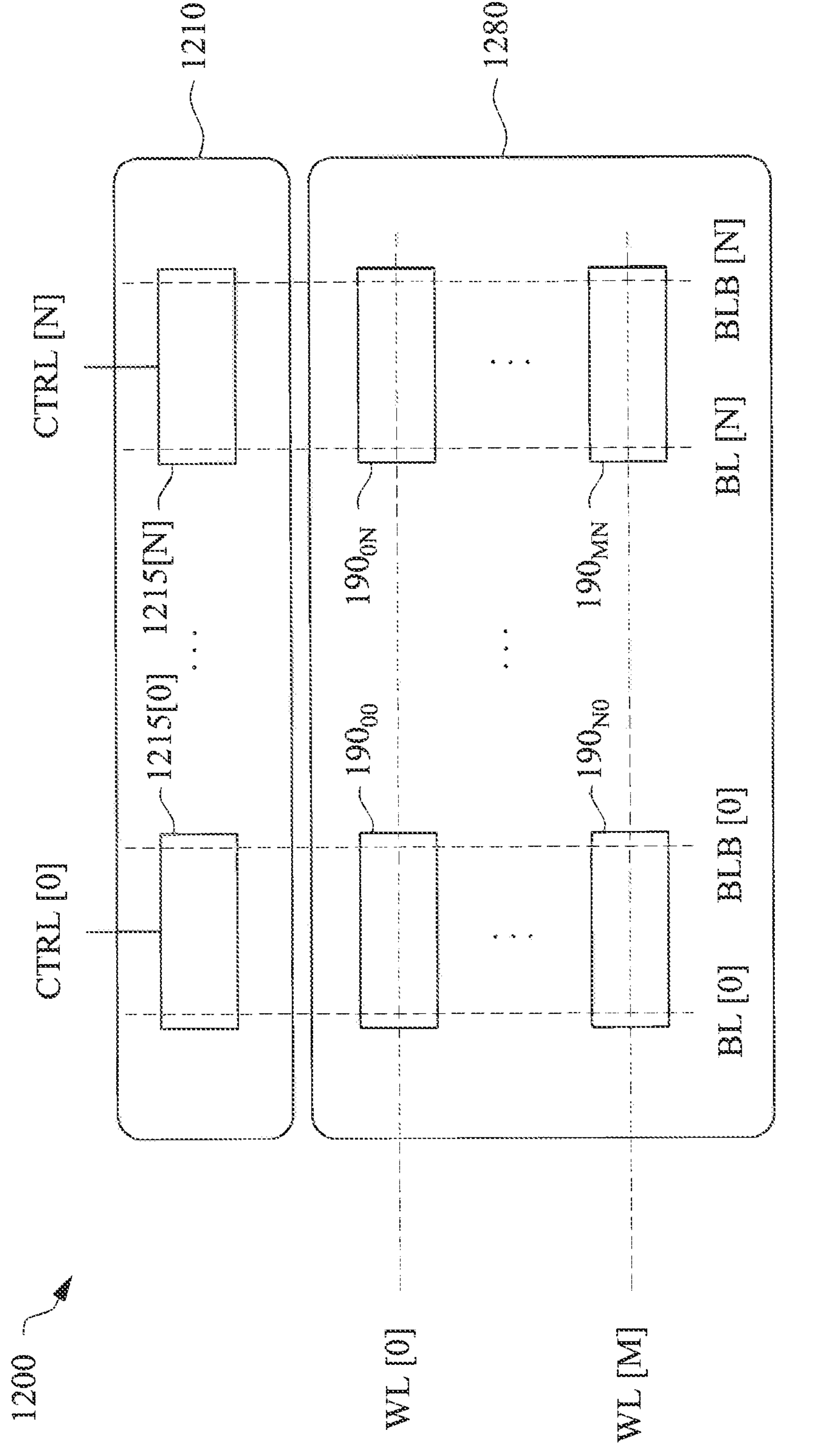
FIG. 12 is an illustration of a memory system with a pre-charge cell for each column of memory cells in a memory array, according to some embodiments of the present disclosure.

FIG. 12 is an illustration of a memory system 1200 with a pre-charge cell for each column of memory cells in a memory array, according to some embodiments. Memory system 1200 includes a pre-charge circuit 1210 and an array of memory cells 1280.

In some embodiments, the memory cells in array of memory cells 1280 can be SRAM cells. Each of the SRAM cells can have a 6T circuit topology, as shown in FIG. 2, according to some embodiments. Referring to FIG. 12, array of memory cells 1280 has "M" number of rows and "N" number of columns. Similar to the description of SRAM array 180 of FIG. 1, each memory cell 190 in array of memory cells 1280 can be accessed for memory read and memory write operations using a memory address. Based on the memory address, a row of memory cells (e.g., memory cells $\mathbf{190}_{00}$-$\mathbf{190}_{0N}$) can be accessed via one of wordlines WL[0] WL[M] and a column of memory cells (e.g., memory cells $\mathbf{190}_{00}$-$\mathbf{190}_{M0}$) can be accessed via one of bitline pairs BL[0]/BLB[0]-BL[N]/BLB[N].

In some embodiments, pre-charge circuit 1210 includes a row of pre-charge cells 1215[0]-1215[N], where a pre-charge cell 1215 is coupled to each column of memory cells in array of memory cells 1280. For example, as shown in FIG. 12, pre-charge cell 1215[0] is coupled to memory cells $\mathbf{190}_{00}$-$\mathbf{190}_{M0}$ in column '0' of array of memory cells 1280 and pre-charge cell 1215[N] is coupled to memory cells $\mathbf{190}_{0N}$-$\mathbf{190}_{MN}$ in column 'N' of array of memory cells 1280. In some embodiments, pre-charge cell 1215 can have any one of the pre-charge cell topologies described herein, such as pre-charge cell 315 of FIG. 3, pre-charge cell 415 of FIG. 4A, pre-charge cell 515 of FIG. 5A, pre-charge cell 615 of FIG. 6, and pre-charge cell 715 of FIG. 7.

Figure 13:
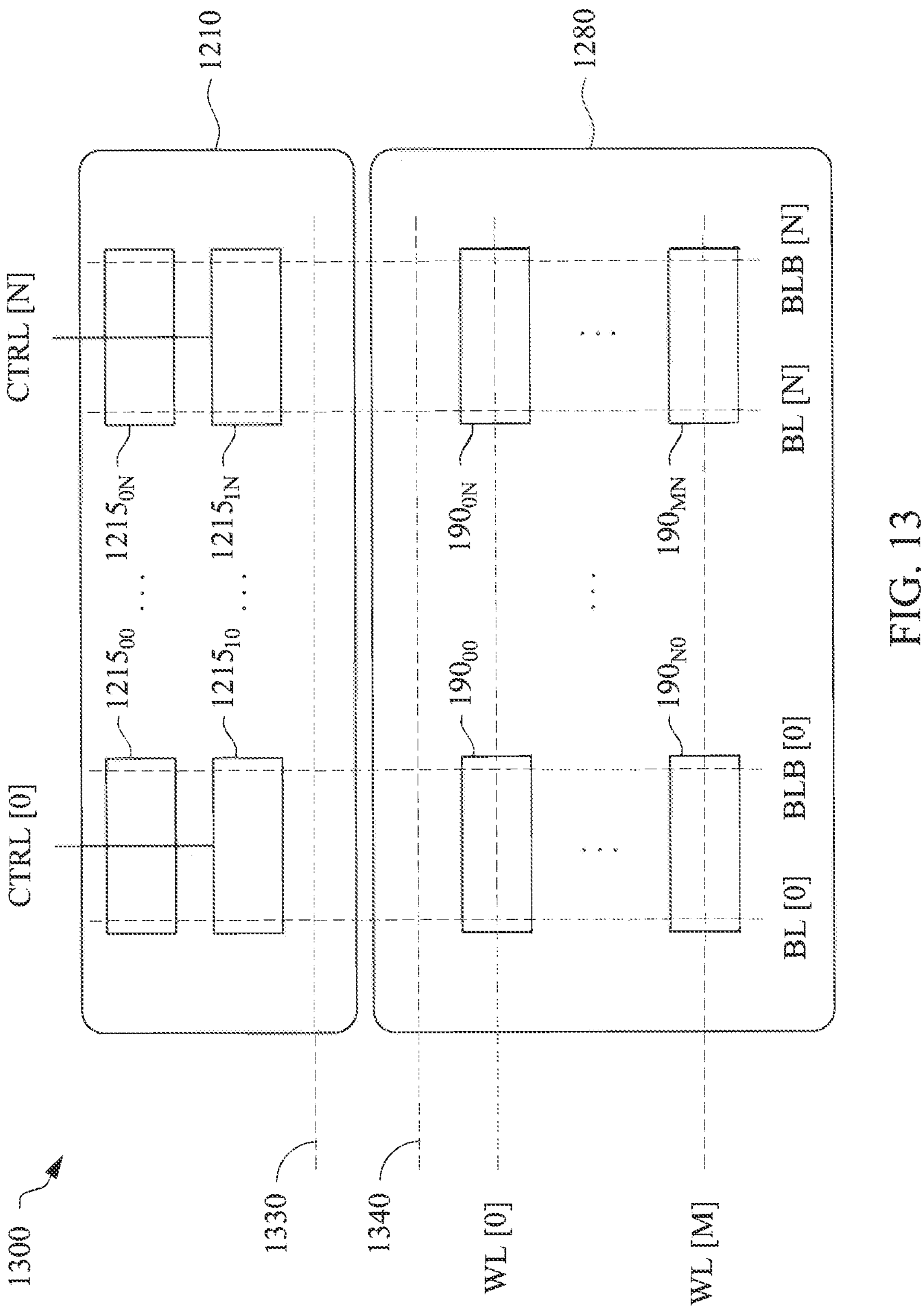
FIG. 13 is an illustration of a memory system with multiple pre-charge cells for each column of memory cells in a memory array, according to some embodiments of the present disclosure.

The pre-charge circuit in the memory system is not limited to a single row of pre-charge cells. In some embodiments, referring to FIG. 13, pre-charge circuit 1210 includes multiple rows of pre-charge cells, where multiple pre-charge cells 1215 are coupled to each column of memory cells in array of memory cells 1280. In some embodiments, the multiple pre-charge cells 1215 coupled to each column of memory cells are arranged in a stacked configuration, such as the stacked configuration of pre-charge cells shown in FIGS. 8-10. In some embodiments, any number of pre-charge cells can be arranged in the stacked configuration based on a desired pre-charge strength to each column of memory cells.

Further, for each column of memory cells in array of memory cells 1280, pre-charge circuit 1210 can include one or more write assist cells (not shown in FIGS. 12 and 13), such as write assist cell 830 described above with respect to FIGS. 8-10. In some embodiments, each of pre-charge circuit architecture 800 of FIG. 8, pre-charge circuit architecture 900 of FIG. 9, pre-charge circuit architecture 1000 of FIG. 10, and combined pre-charge/write-assist cell 1100 of FIG. 11 can be coupled to each column of memory cells in array of memory cells 1280 of FIG. 12. In some embodiments, any number of pre-charge cells, write assist cells, and combined pre-charge/write-assist cells can be arranged in a stacked configuration where each stacked configuration is coupled to each column of memory cells in array of memory cells 1280—based on a desired pre-charge and write assist strength to each column of memory cells.

In some embodiments, memory system 1300 includes power supplies 1330 and 1340 provided to pre-charge circuit 1210 and array of memory cells 1280, respectively. In some embodiments, power supplies 1330 and 1340 can be one or more of 0.4 V, 0.6 V, 0.7 V, 1.0 V, 1.2 V, 1.8 V, 2.4 V, 3.3 V, 5 V, and any other suitable power supply voltage. Power supply 1330 can provide a power supply voltage to pre-charge cells and/or write assist cells in pre-charge circuit 1210 (e.g., first reference voltage 314 of FIGS. 3, 4A, 5A, and 6-10 and first reference voltage 1114 of FIG. 11A) and can remain "on" to reduce pre-charge time, according to some embodiments. Power supply 1340 can be toggled "on" and "off" depending on an active state of a memory cell to reduce power consumption, according to some embodiments. For example, if one or more memory cells 190 are in an active state (e.g., the one or more memory cells are subject to a memory read operation or a memory write operation), power supply 1340 can be turned "on" for the one or more memory cells 190. Conversely, if one or more memory cells 190 are in an inactive state (e.g., the one or more memory cells are not subject to a memory read operation or a memory write operation), power supply 1340 can be turned "off" for the one or more memory cells 190.

Figure 14:
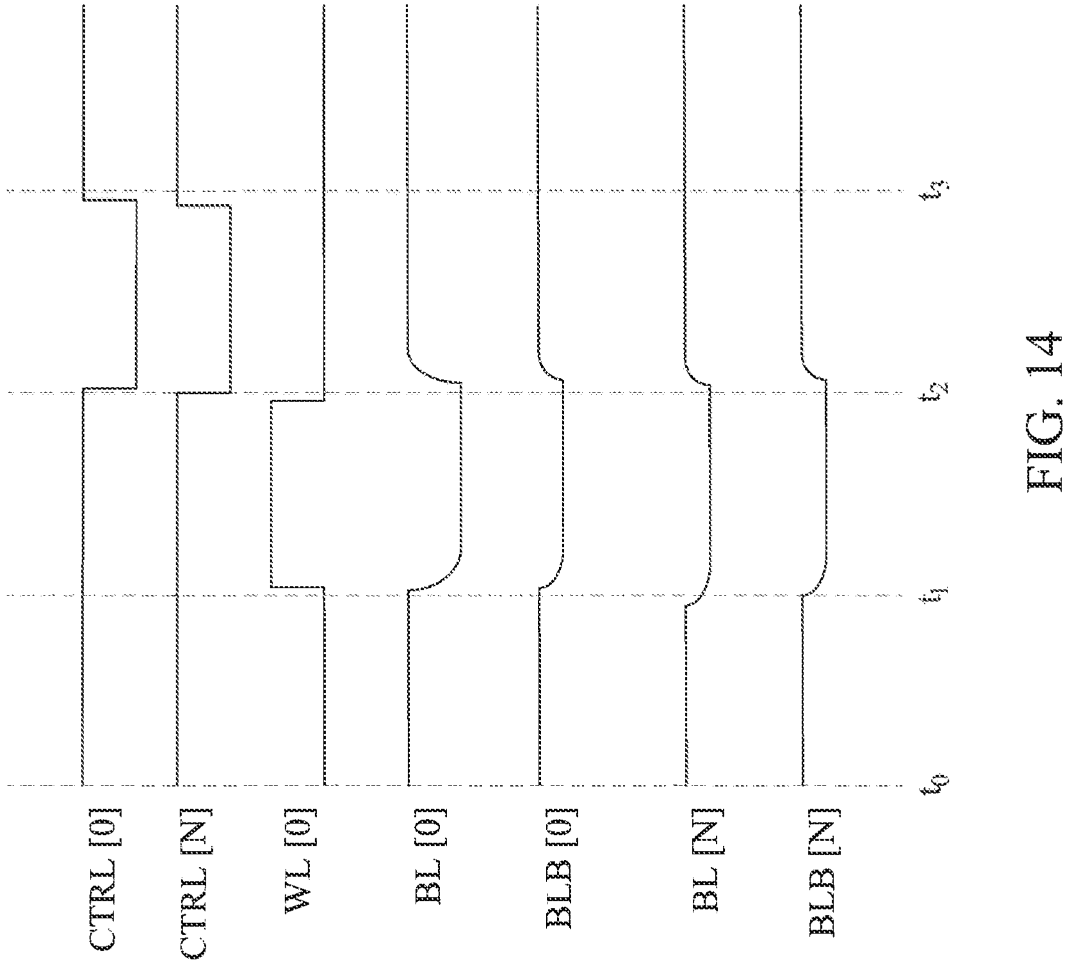
FIG. 14 is an illustration of example waveforms associated with the operation of a memory system with a pre-charge circuit, according to some embodiments of the present disclosure.

FIG. 14 is an illustration of example waveforms 1400 associated with the operation of a memory system with a pre-charge circuit, according to some embodiments. For illustration purposes, memory system 1200 will be used to facilitate in the description of waveforms 1400. Waveforms 1400 also apply to other memory systems, such as SRAM device 100 of FIG. 1 and memory system 1300 of FIG. 13, which are within the spirit and scope of the present disclosure.

At time $t_0$, memory system 1200 is in a standby state. A control signal CTRL[0] that activates pre-charge cell 1215[0] for column '0' of memory cells $\mathbf{190}_{00}$-$\mathbf{190}_{M0}$, a control signal CTRL[N] that activates pre-charge cell 1215[N] for column 'N' of memory cells $\mathbf{190}_{0N}$-$\mathbf{190}_{MN}$, and a wordline signal for row '0' of memory cells $\mathbf{190}_{00}$-$\mathbf{190}_{0N}$ (WL[0]) are deactivated (or turned "off"). In some embodiments, control signal CTRL[0] and control signal CTRL[N] are active-low signals, meaning that a logic low value (e.g., ground or 0 V) activates pre-charge cell 1215[0] and pre-charge cell 1215[N], respectively, and a logic high value (e.g., a power supply voltage) deactivates the pre-charge cells. Voltages on the bitline pairs BL/BLB for columns '0' and 'N' are initialized to a predetermined voltage, such as a power supply voltage (e.g., first reference voltage 314 of FIG. 3 and first reference voltage 1114 of FIG. 11), according to some embodiments.

Although two columns of memory cells—columns '0' and 'N' are described with respect to waveforms 1400, the voltages on the bitline pairs BL/BLB for the other columns of memory cells—column '1' through column 'N−1'—follow the same or similar voltage characteristics as the bitline pair BL/BLB for column 'N'. Further, although two pre-charge cells—pre-charge cells 1215[0] and 1215[N] are described with respect to waveforms 1400, control signals for the other pre-charge cells 1215[1]-1215[N−1]-corresponding to control signal CTRL[1]-control signal CTRL [N−1], respectively—follow the same waveform pattern as control signal CTRL[N]. With respect to the wordline signals for row '1' through row 'M−1', these wordline signals are deactivated (or turned "off").

At time $t_1$, memory system 1200 transitions to a memory operation state—e.g., a read operation or a write operation. Control signal CTRL[0] and control signal CTRL[N] remain deactivated; thus, pre-charge cell 1215[0] and pre-charge cell 1215[N] remain deactivated (or remain "off"). At this time, the wordline signal WL[0] is activated—e.g., transitioning from a logic low value to a logic high value. Although not shown in waveforms 1400, column '0' is activated (or selected) by a column decoder (e.g., column decoder 140 of FIG. 1). As a result of row '0' and column '0' being activated (or selected), a memory operation—such as a memory read operation or a memory write operation—can be performed at memory cell $\mathbf{190}_{00}$. In turn, the bitline pair BL[0]/BLB[0] for memory cell $\mathbf{190}_{00}$ can transition. For example, as shown in waveforms 1400, the bitline BL[0] can transition from a logic high value to a logic low value. And, although the bitline BLB[0] is the complement of BL[0], the voltage level on the bitline BLB[0] may not remain at an ideal logic high voltage level (e.g., a power supply voltage) due to the strength of PFET pull-up devices in an SRAM cell (e.g., PFET pull-up devices 260 and 270 of FIG. 2) to pass the logic high voltage level. Thus, as shown in waveforms 1400, the voltage level on the bitline BLB[0] dips at time $t_1$. Further, with respect to the bitline pair BL[N]/BLB[N], the voltage levels on this bitline pair may also dip at time $t_1$ due a parasitic coupling effect that may occur when the bitline BL[0] transitions from the logic high value to the logic low value.

At time $t_2$, after the memory operation has completed, memory system 1200 is in a pre-charge operation state. The wordline signal WL[0] is deactivated e.g., transitioning from a logic high value to a logic low value. At this time, control signal CTRL[0] and control signal CIRL[N] are activated; thus, pre-charge cell 1215[0] and pre-charge cell 1215[N] are activated (or turned “on”). As a result, the bitline pairs BL[0]/BLB[0] and BL[N]/BLB[N] are charged to the predetermined voltage, such as a power supply voltage (e.g., first reference voltage 314 of FIG. 3 and first reference voltage 1114 of FIG. 11), according to some embodiments.

At time $t_3$, memory system 1200 is in the standby state e.g., similar to the state at time $t_0$. Control signal CTRL[0] and control signal CTRL[N] are deactivated; thus, pre-charge cell 1215[0] and pre-charge cell 1215[N] are deactivated (or turned “off”). At this point, the bitline pairs BL[0]/BLB[0] and BL[N]/BLB[N] are pre-charged to the predetermined voltage and another memory operation—e.g., memory read operation and memory write operation—can be performed. The above cycle—e.g., operations at times $t_0$ to $t_1$ can be repeated for multiple memory read operations and/or multiple memory write operations.

The various embodiments of the pre-charge cell described herein can have different performance characteristics. For example, for a given memory array architecture, a combined pre-charge/write-assist cell (e.g., combined pre-charge/write-assist cell 1100 of FIG. 11) can charge a bitline pair BL/BLB for a column of memory cells faster than a pre-charge circuit architecture with a write assist cell and pre-charge cell in a stacked configuration (e.g., pre-charge circuit architecture 800 of FIG. 8, pre-charge circuit architecture 900 of FIG. 9, and pre-charge circuit architecture 1000 of FIG. 10). Further, certain stacked configurations can have different performance characteristics than others. For example, a stacked configuration with write assist cell 830 and pre-charge cell 515 can charge a bitline pair BL/BLB for a column of memory cells faster than a stacked configuration with write assist cell 830 and pre-charge cell 415.

Figure 15:
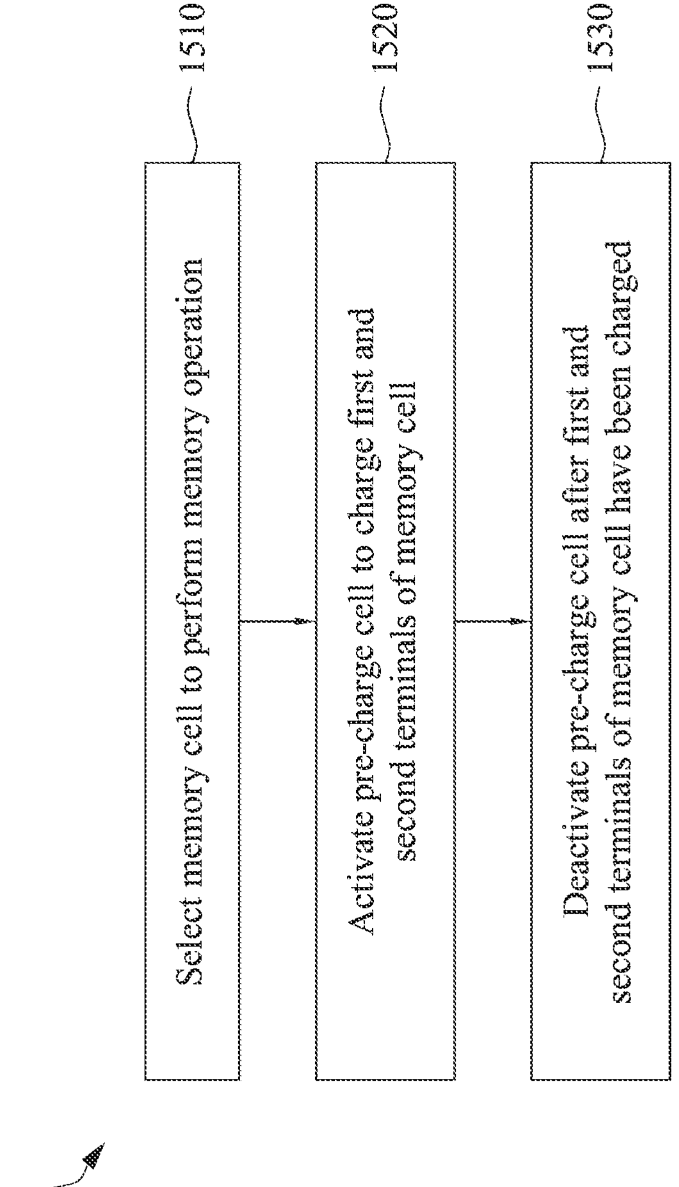
FIG. 15 is an illustration of a method for a pre-charge operation performed on a memory system, according to some embodiments of the present disclosure.

FIG. 15 is an illustration of a method 1500 for a pre-charge operation performed on a memory system, according to some embodiments. Method 1500 applies to the pre-charge cell embodiments described herein. For illustration purposes, the operations of method 1500 will be described with reference to memory system 1200 of FIG. 12. The operations can be performed with other pre-charge circuit architectures—such as SRAM device 100 of FIG. 1 and memory system 1300 of FIG. 13—and can be performed in a different order or not performed depending on specific applications.

In operation 1510, a memory cell in an array of memory cells is selected to perform a memory operation using first and second terminals of the memory cell. In some embodiments, a wordline and a column from memory array 1280 of memory system 1200 can be used to select a memory cell 190. In some embodiments, the memory operation can be a memory read operation or a memory write operation. The first and second terminals of the memory cell can be a bitline pair BL/BLB of the memory cell. An example of operation 1510 is the memory operation (e.g., memory read operation or memory write operation) performed at time $t_1$ in waveforms 1400 of FIG. 14.

In operation 1520, a pre-charge cell is activated to charge the first and second terminals of the memory cell to a reference voltage (e.g., a power supply voltage, such as 0.4 V, 0.6 V, 0.7 V, 1.0 V, 1.2 V, 1.8 V, 2.4 V, 3.3 V, 5 V, and any other suitable voltage) while the memory cell is de-selected. In some embodiments, referring to FIG. 12, the second control signal can be a control signal CTRL[0] that activates a pre-charge cell 1215[0] for column ‘0’ of memory cells 190$_{00}$-190$_{M0}$. The pre-charge cell can be activated after the memory operation (initiated in operation 1510) has completed and after the memory cell is de-selected (e.g., wordline signal WL[0] is deselected). The pre-charge cell can include a transistor with the following: a gate terminal; a first source/drain (S/D) terminal coupled to the reference voltage; and a second S/D terminal coupled to the first or second terminal of the memory cell, where the transistor is configured to pass the reference voltage from the first S/D terminal to the second S/D terminal in response to the second control signal being applied to the gate terminal. An example of memory operation 1520 is the memory system operation performed at time $t_2$ in waveforms 1400 of FIG. 14.

In operation 1530, the pre-charge cell is deactivated after the first and second terminals of the memory cells have been charged to the reference voltage. An example of memory operation 1530 is the memory system operation performed at time $t_3$ in waveforms 1400 of FIG. 14.

Embodiments of the present disclosure describe a memory system with a pre-charge circuit configured to charge a bitline pair BL/BLB. In some embodiments, the pre-charge circuit includes pre-charge cells, in which each of the pre-charge cells can be coupled to a column of memory cells in an array of memory cells. Depending on a desired pre-charge strength, multiple pre-charge cells can be arranged in a stacked configuration. Additionally, in some embodiments, a write assist cell can be coupled to one or more pre-charge cells in a stacked configuration. And depending on a desired write assist strength, multiple write assist cells can be coupled to the one or more pre-charge cells in the stacked configuration. In some embodiments, a combined pre-charge cell and write assist cell can be implemented to provide write assist and pre-charge functionalities.

Embodiments of the present disclosure include a memory device with a memory cell, a first transistor, and a second transistor. The memory cell includes a first terminal and a second terminal. The first transistor includes a first gate terminal, a first S/D terminal coupled to a reference voltage, and a second S/D terminal coupled to the first terminal of the memory cell. The first transistor is configured to pass the reference voltage from the first S/D terminal to the second S/D terminal in response to a control signal being applied to the first gate terminal. Further, the second transistor includes a second gate terminal, a third S/D terminal coupled to the reference voltage, and a fourth S/D terminal coupled to the second terminal of the memory cell. The second transistor is configured to pass the reference voltage from the third S/D terminal to the fourth S/D terminal in response to the control signal being applied to the second gate terminal.

Embodiments of the present disclosure include a memory device with an array of memory cells and a pre-charge circuit. The array of memory cells includes a first memory cell and a second memory cell. Each of the first and second memory cells includes a first terminal and a second terminal. Further, the pre-charge circuit is coupled to the array of memory cells and includes a first pre-charge cell and a second pre-charge cell. The first pre-charge cell, is configured to pass a reference voltage to the first and second terminals of the first memory cell based on a first control signal. The second pre-charge cell is configured to pass the reference voltage to the first and second terminals of the second memory cell based on a second control signal. Each of the first and second pre-charge cells includes a first transistor and a second transistor. The first transistor includes a first gate terminal, a first S/D terminal coupled to the reference voltage, and a second S/D terminal coupled to the first terminal of the first or second memory cell. The first transistor is configured to pass the reference voltage from the first S/D terminal to the second S/D terminal. The second transistor includes a second gate terminal, a third S/D terminal coupled to the reference voltage, and a fourth S/D terminal coupled to the second terminal of the first or second memory cell. The second transistor is configured to pass the reference voltage from the third S/D terminal to the fourth S/D terminal.

Embodiments of the present disclosure include a method for a pre-charge operation performed on a static random access memory. The method includes: (i) selecting a memory cell in an array of memory cells to perform a memory operation using first and second terminals of the memory cell; and (ii) activating a pre-charge cell to charge the first and second terminals of the memory cell to a reference voltage while the memory cell is de-selected. The pre-charge cell includes a transistor with a gate terminal, a first S/D terminal coupled to the reference voltage, and a second S/D terminal coupled to the first or second terminal of the memory cell. The transistor is configured to pass the reference voltage from the first S/D terminal to the second S/D terminal in response to a control signal being applied to the gate terminal.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a memory cell electrically coupled to a first bitline and to a second bitline;

a first transistor with a first gate terminal coupled to a control signal, a first source/drain (S/D) terminal coupled to a power supply voltage, and a second S/D terminal, wherein the first transistor is configured to pass the power supply voltage from the first S/D terminal to the second S/D terminal in response to the control signal transitioning from a first value to a second value at the first gate terminal;

a second transistor with a second gate terminal coupled to the control signal, a third S/D terminal coupled to the power supply voltage, and a fourth S/D terminal, wherein the second transistor is configured to pass the power supply voltage from the third S/D terminal to the fourth S/D terminal in response to the control signal transitioning from the first value to the second value at the second gate terminal;

a first pass transistor with a third gate terminal coupled to the control signal, a fifth S/D terminal connected to the second S/D terminal, and a sixth S/D terminal connected to the first bitline, wherein the first pass transistor is configured to pass the power supply voltage from the first transistor to the first bitline in response to the control signal transitioning from the first value to the second value at the third gate terminal; and a second pass transistor with a fourth gate terminal coupled to the control signal, a seventh S/D terminal connected to the fourth S/D terminal, and an eighth S/D terminal connected to the second bitline, wherein the second pass transistor is configured to pass the power supply voltage from the second transistor to the second bitline in response to the control signal transitioning from the first value to the second value at the fourth gate terminal, and wherein the first transistor, the second transistor, the first pass transistor, and the second pass transistor are the same type of transistor.

2. The device of claim 1, further comprising:

a third transistor with a fifth gate terminal coupled to the control signal, a ninth S/D terminal coupled to a reference voltage, and a tenth S/D terminal connected to the second S/D terminal, wherein the third transistor is configured to pass the reference voltage from the ninth S/D terminal to the first pass transistor in response to the control signal transitioning from the second value to the first value.

3. The device of claim 2, further comprising:

a fourth transistor with a sixth gate terminal connected to the second gate terminal coupled to the control signal, an eleventh S/D terminal coupled to the reference voltage, and a twelfth S/D terminal connected to the fourth S/D terminal, wherein the fourth transistor is configured to pass the reference voltage from the eleventh S/D terminal to the second pass transistor in response to the control signal transitioning from the second value to the first value.

4. The device of claim 3, wherein:

the first transistor, the first pass transistor, the second transistor, and the second pass transistor are p-type field effect transistors; and the third transistor and the fourth transistor are n-type field effect transistors.

5. The device of claim 1, wherein:

the first pass transistor is a p-type field effect transistor; and the second pass transistor is an other p-type field effect transistor.

6. The device of claim 1, wherein the first transistor, the first pass transistor, the second transistor, and the second pass transistor are n-type field effect transistors.

7. The device of claim 1, wherein the first transistor, the first pass transistor, the second transistor, and the second pass transistor are p-type field effect transistors.

8. The device of claim 1, wherein the first and second transistors are p-type field effect transistors.

9. The device of claim 1, wherein the first and second transistors are n-type field effect transistors.

10. A memory device, comprising:

a memory cell comprising a first bitline node and a second bitline node;

a first transistor device coupled to a power supply voltage and comprising:

a first gate terminal configured to activate the first transistor device based on a control signal transitioning from a first value to a second value; and a first source/drain (S/D) terminal configured to receive the power supply voltage based on the control signal transitioning from the first value to the second value at the first gate terminal;

a second transistor device coupled to the power supply voltage and comprising:

a second gate terminal connected to the first gate terminal and configured to activate the second transistor device based on the control signal transitioning from the first value to the second value; and a second S/D terminal configured to receive the power supply voltage based on the control signal transitioning from the first value to the second value at the second gate terminal;

a first pass device connected to the first transistor device and the memory cell, wherein the first pass device comprises:

a third S/D terminal connected to the first bitline node; and a third gate terminal configured to activate the first pass device to pass the power supply voltage from the first S/D terminal of the first transistor device to the third S/D terminal and the first bitline node based on the control signal transitioning from the first value to the second value at the third gate terminal; and a second pass device connected to the second transistor device and the memory cell, wherein the second pass device comprises:

a fourth S/D terminal connected to the second bitline node; and a fourth gate terminal configured to activate the second pass device to pass the power supply voltage from the second S/D terminal of the second transistor device to the fourth S/D terminal to the second bitline node based on the control signal transitioning from the first value to the second value at the fourth gate terminal, wherein the first gate terminal, the second gate terminal, the third gate terminal, and the fourth gate terminal are connected to the control signal.

11. The memory device of claim 10, wherein:

the first transistor device is configured to pass the power supply voltage to the first pass device in response to the control signal being applied to the first gate terminal of the first transistor device; and the second transistor device is configured to pass the power supply voltage to the second pass device in response to the control signal being applied to second gate terminal of the second transistor device.

12. The memory device of claim 11, further comprising:

a third transistor device configured to pass a reference voltage to the first pass device in response to the control signal transitioning from the second value to the first value; and a fourth transistor device configured to pass the reference voltage to the second pass device in response to the control signal transitioning from the second value to the first value.

13. The memory device of claim 12, wherein:

the first pass device, the second pass device, the first transistor device, and the second transistor device are p-type field effect transistors; and the third transistor device the fourth transistor device are n-type field effect transistors.

14. The memory device of claim 10, wherein the first pass device, the second pass device, the first transistor device, and the second transistor device are n-type field effect transistors.

15. The memory device of claim 10, further comprising:

a third transistor device configured to pass a reference voltage to the first pass device; and a fourth transistor device configured to pass the reference voltage to the second pass device.

16. The memory device of claim 15, wherein the first pass device, the second pass device, the third transistor device, and the fourth transistor device are n-type field effect transistors.

17. A memory system, comprising:

a memory array comprising a memory cell with a first bitline node and a second bitline node; and a pre-charge circuit coupled to the memory array and comprising:

a first transistor device coupled to a power supply voltage and comprising a first gate terminal configured to receive a control signal that transitions from a first value to a second value at the first gate terminal;

a second transistor device coupled to the power supply voltage and comprising a second gate terminal configured to receive the control signal that transitions from the first value to the second value at the second gate terminal;

a first pass device comprising a third gate terminal configured to cause the first pass device to pass the power supply voltage from the first transistor device to the first bitline node based on the control signal transitioning from the first value to the second value at the third gate terminal; and a second pass device comprising a fourth gate terminal configured to cause the second pass device to pass the power supply voltage from the second transistor device to the second bitline node based on the control signal transitioning from the first value to the second value at the fourth gate terminal, wherein the first transistor device, the second transistor device, the first pass device, and the second pass device are the same type of transistor, and wherein the first gate terminal, the second gate terminal, the third gate terminal, and the fourth gate terminal are connected to the control signal.

18. The memory system of claim 17, wherein:

the first transistor device is configured to pass the power supply voltage to the first pass device in response to the control signal being applied to the first gate terminal of the first transistor device; and the second transistor device is configured to pass the power supply voltage to the second pass device in response to the control signal being applied to the second gate terminal of the second transistor device.

19. The memory system of claim 18, wherein the pre-charge circuit further comprises:

a third transistor device configured to pass a reference voltage to the first pass device in response to the control signal being applied to a fifth gate terminal of the third transistor device; and a fourth transistor device configured to pass the reference voltage to the second pass device in response to the control signal being applied to a sixth gate terminal of the fourth transistor device.

20. The memory system of claim 17, wherein the pre-charge circuit further comprises:

a third transistor device configured to pass a reference voltage to the first pass device; and a fourth transistor device configured to pass the reference voltage to the second pass device.

* * * * *